United States Patent
Kang

(10) Patent No.: US 6,392,917 B1
(45) Date of Patent: *May 21, 2002

(54) NONVOLATILE FERROELECTRIC MEMORY AND METHOD FOR FABRICATING THE SAME

(75) Inventor: Hee Bok Kang, Daejeon-si (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/698,226

(22) Filed: Oct. 30, 2000

(30) Foreign Application Priority Data

Nov. 22, 1999 (KR) ............................................ P99-51975

(51) Int. Cl.$^7$ ................................................ G11C 11/22
(52) U.S. Cl. .................................... 365/145; 365/149
(58) Field of Search ................................ 365/145, 149; 257/295

(56) References Cited

U.S. PATENT DOCUMENTS

| | | | |
|---|---|---|---|
| 4,873,664 A | 10/1989 | Eaton, Jr. ............... | 364/145 |
| 5,345,415 A | * 9/1994 | Nakao et al. ............. | 365/145 |
| 5,680,344 A | 10/1997 | Seyyedy ................. | 365/145 |
| 6,118,687 A | * 9/2000 | Kang ..................... | 365/145 |

* cited by examiner

Primary Examiner—Huan Hoang
(74) Attorney, Agent, or Firm—Fleshner & Kim, LLP

(57) ABSTRACT

A ferroelectric memory and method for fabricating the same includes a plurality of first gate electrodes and second gate electrodes formed on an active region of a substrate electrically separated form each other, a plurality of first electrodes of first ferroelectric capacitors each connected to the substrate at one side of the first gate electrode, and a plurality of first electrodes of the second ferroelectric capacitors each connected to the substrate at one side of the second gate electrode. Ferroelectric layers respectively formed on the first electrodes, and second electrodes are formed on the ferroelectric layers. A first metal line electrically couples the plurality of first gate electrodes, and a second metal line electrically couples the plurality of second gate electrodes. The ferroelectric memory has a simplified fabrication process and an increased area of the capacitor that is favorable for high density device packing. The first and second metal lines can be the second electrodes of the ferroelectric capacitors.

23 Claims, 48 Drawing Sheets

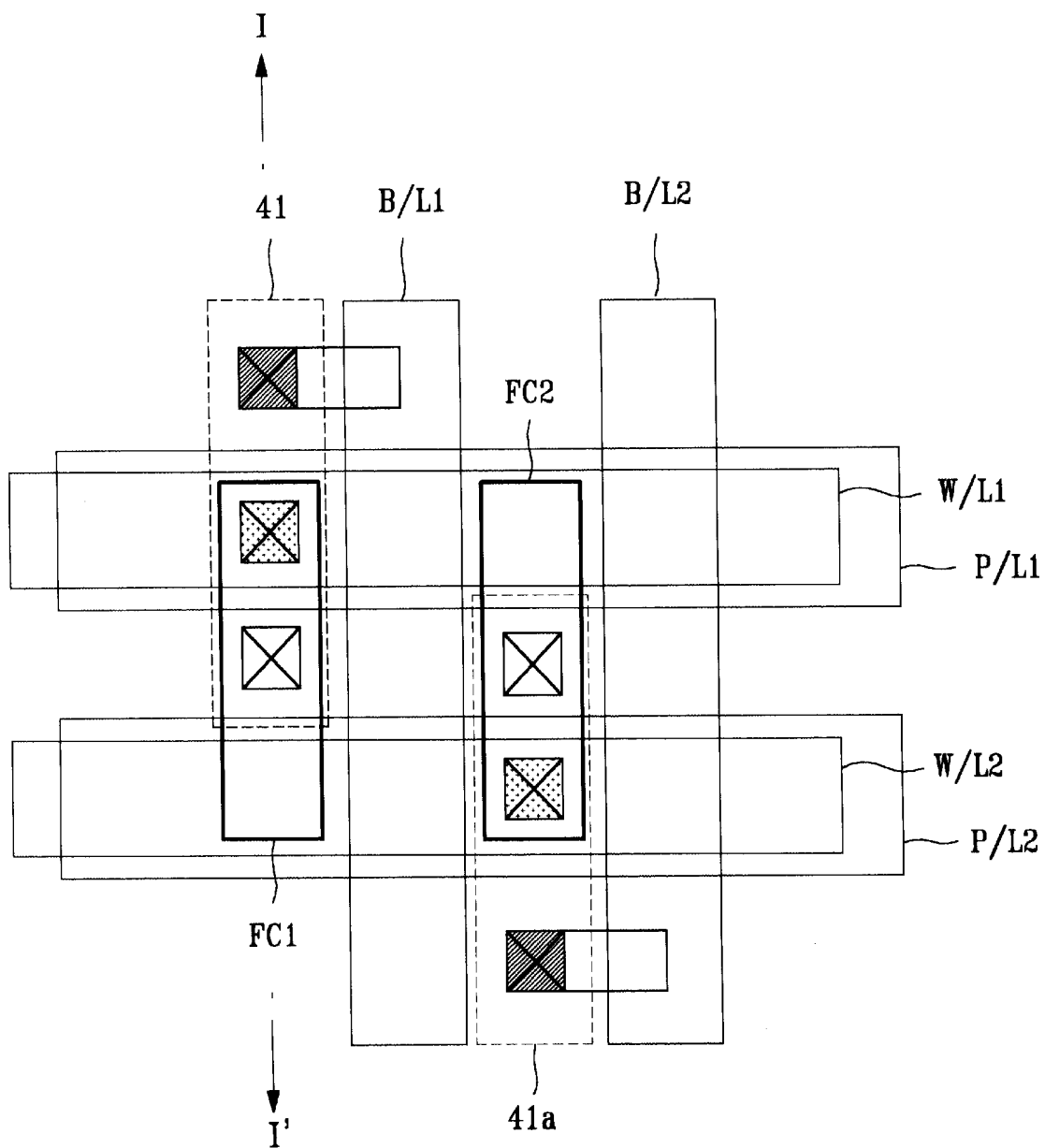

US 6,392,917 B1

NONVOLATILE FERROELECTRIC MEMORY AND METHOD FOR FABRICATING THE SAME

BACKGROUND OF THE INVENTION

1. Field of the Invention

The present invention relates to a semiconductor device, and more particularly, to a nonvolatile ferroelectric memory and a method for fabricating the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

With reference to FIG. 3b, the reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

A related art nonvolatile ferroelectric memory and a method for fabricating the nonvolatile ferroelectric memory will now be described. FIG. 4a is a diagram that illustrates a layout of a related art nonvolatile ferroelectric memory.

Referring to FIG. 4a, the related art nonvolatile ferroelectric memory is provided with a first active region 41 and a second active region 41a asymmetrically formed at fixed intervals. A first wordline W/L1 is formed to cross the first active region 41, and a second wordline W/L2 is formed to cross the second active region 41a spaced a distance from the first wordline W/L1. A first bitline B/L1 is formed in a direction to cross the first and second wordlines at one side of the first active region 41, and a second bitline B/L2 is formed parallel to the first bitline B/L1 to cross the first and second wordlines at one side of the second active region 41a. A first ferroelectric capacitor FC1 is formed over the first wordline W/L1 and the second wordline W/L2 and is connected to the first active region 41. A second ferroelectric capacitor FC2 is formed over the first wordline W/L1 and is electrically connected to the second active region 41a. A first plate line P/L1 is formed over the first wordline W/L1 and is electrically connected to the first ferroelectric capacitor FC1, and a second plate line P/L2 is formed over the second wordline W/L2 and is electrically connected to the second ferroelectric capacitor FC2. FIG. 4a is a diagram that illustrates a layout of a unit cell, wherein the related art nonvolatile ferroelectric memory has the first and second ferroelectric capacitors FC1 and FC2 formed extending along a bitline direction, and the first plateline P/L1 formed over the first wordline W/L1 and the second plateline P/L2 formed over the second wordline W/L2.

FIG. 4b is a diagram that illustrates a cross-section across line I–I' in FIG. 4a. Referring to FIG. 4b, the related art nonvolatile ferroelectric memory is provided with a substrate 51 having an active region and a field region defined thereon, a first wordline 54 and a second wordline 54a formed over the active region and the field region with a first insulating layer 53 disposed inbetween, and first source/drain impurity regions 55 and 56 formed on both sides of the first wordline 54. Second source/drain impurity regions (not shown) are formed on both sides of the second wordline 54a. A second insulating layer 57 is formed on an entire surface inclusive of the first and second wordlines 54 and 54a having a contact hole exposing the first drain impurity region 56, and a first plug layer 58a is stuffed in the contact hole. A first metal layer 59 connects the first plug layer 58a and the first bitline (not shown). A third insulating layer 60 is formed on an entire surface inclusive of the first metal layer 59 having a contact hole exposing the first source impurity region 55, and a second plug layer 62 is stuffed in the contact hole. A barrier metal layer 63 is electrically connected to the second plug layer 62 and extended horizontally over the first wordline to the second wordline 54a. A lower electrode 64 of the first ferroelectric capacitor FC1 is formed on the barrier metal layer 63, a ferroelectric film 65 and an upper electrode 66 of the first ferroelectric capacitor are stacked on the lower electrode 64 of the first ferroelectric capacitor FC1 in succession. A fourth insulating layer 67 is formed on an entire surface inclusive of the upper electrode 66 of the second ferroelectric capacitor. A first plate line 68 is formed over the first wordline 54 and electrically connected to the upper electrode 66 of the first ferroelectric capacitor FC1 through the fourth insulating layer, and a second plate line 68a formed over the second wordline 54a spaced from the first plate line 68.

A method for fabricating the related art nonvolatile ferroelectric memory of FIGS. 4a–4b will now be described. FIGS. 5a~5f are diagrams that illustrate cross-sections showing the steps of a method for fabricating the related art nonvolatile ferroelectric memory shown along line I–I' in FIG. 4a. As shown in FIG. 5a, a portion of a semiconductor substrate 51 is etched to form a trench, and an insulating film is stuffed in the trench to form a device isolation layer 52. A first insulating layer 53 is formed on the substrate in the active region inclusive of the device isolation layer 52. A wordline material layer is formed on the first insulating layer 53, and patterned to form first and second wordlines 54 and 54a at fixed intervals.

As shown in FIG. 5b, the wordlines 54 and 54a are used as masks in implanting impurity ions to form a source impurity region 55 and a drain impurity region 56 having a conduction type opposite to the substrate 51. The source/drain impurity regions 55 and 56 are source/drain impurity regions of the first transistor T1 that takes the first wordline 54 as a gate electrode. Then, a second insulating layer 57 is formed on an entire surface of the substrate 51 inclusive of the first and second wordlines 54 and 54a. A photoresist layer (not shown) is coated on the second insulating layer 55 and patterned, and the patterned photoresist layer is used as a mask in selectively etching the second insulating layer 57 to form a contact hole 58 exposing the drain impurity region 56.

As shown in FIG. 5c, a conductive material is stuffed in the contact hole to form a first plug layer 58a, and first metal layer 59 is formed to connect the first plug layer 58a and the first bitline B/L1. Though not shown, the second bitline B/L2 is electrically connected to the drain impurity region of the second transistor T2.

As shown in FIG. 5d, a third insulating layer 60 is formed on an entire surface inclusive of the first metal layer 59. A photoresist layer (not shown) is coated on the third insulating layer 60, patterned and used as mask in selectively etching the third insulating layer to form a contact hole 61 exposing the source impurity region 55.

As shown in FIG. 5e, a conductive material is stuffed in the contact hole 61 to form a second plug layer 62 electrically connected to the source impurity region 55. A barrier metal layer 63 is formed to be electrically connected to the second plug layer 62 and a lower electrode 64 of the first ferroelectric capacitor FC1. The lower electrode 64, a ferroelectric film 65 and upper electrode 66 of the first ferroelectric capacitor are successively formed on the barrier metal layer 63.

As shown in FIG. 5f, a fourth insulating layer 67 is formed on the upper electrode 66 of the first ferroelectric capacitor and selectively etched by photolithography to form a contact hole exposing a portion of the upper electrode 66 of the first ferroelectric capacitor FC1. Upon formation of a first plate line 68 connected with the upper electrode 66 of the first ferroelectric capacitor through the contact hole, the related art process for fabricating nonvolatile ferroelectric memory is completed. A second plate line 68a is also shown in FIG. 5f.

As described above, the related art nonvolatile ferroelectric memory and the related art method for fabricating the same have various disadvantages. A requirement to form the lower electrode of a capacitor thicker for increasing a sectional area of the lower electrode for securing capacitance causes a problem in that etching of the lower electrode is difficult because the lower electrode of the capacitor is formed of metal. Accordingly, there is a limitation in securing the capacitance coming from the limit of forming a thicker lower electrode of the capacitor. Further, the fabrication process is very difficult because the plate line should be formed in a small space so that a sufficient space is secured distinguishing the plate line from a wordline in an adjacent cell as the wordline and the plate line are formed in every unit cell. In addition, an increase of RC delay of the wordlines is not favorable in embodying a fast nonvolatile ferroelectric memory by decreasing an operational speed.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a nonvolatile ferroelectric memory and a method for fabricating the same, which can simplify a fabrication process and increase a capacitor area suitable for high density device packing.

To achieve at least the above objects and other advantages in a whole or in part and in accordance with the purpose of the present invention, as embodied and broadly described, the nonvolatile ferroelectric memory includes a plurality of first gate electrodes and second gate electrodes formed on an active region of a substrate electrically separated form each other, a plurality of first electrodes of first ferroelectric capacitors each connected to the substrate at one side of the first gate electrode, and a plurality of first electrodes of the second ferroelectric capacitors each connected to the substrate at one side of the second gate electrode, ferroelectric layers respectively formed on the first electrodes, second electrodes of the first ferroelectric capacitors and second electrodes of the second ferroelectric capacitors, both are formed on respective ferroelectric layers, and a first metal line electrically connecting the plurality of first gate electrodes, and a second metal line electrically connecting the plurality of second gate electrodes.

To further achieve the above objects in a whole or in part, there is provided a method for fabricating a nonvolatile ferroelectric memory having first and second transistors, and first and second ferroelectric capacitors, including the steps of (1) defining a first active region and a second active region on a semiconductor substrate, (2) forming a first gate electrode on the first active region of the substrate, and forming a second gate electrode on the second active region of the substrate, (3) forming a first insulating layer having contact holes to expose the substrate on one side of the first and second gate electrodes, (4) forming first electrodes of the ferroelectric capacitors in the contact holes respectively, (5) forming ferroelectric layers respectively on the first electrodes, (6) forming a first split wordline which is a second electrode of the second ferroelectric capacitor connected to the first gate electrode, and for is a second electrode of the first ferroelectric capacitor connected to the second gate electrode, and (7) forming a first bitline connected to the substrate on one side of the first gate electrode, and a second bitline connected to the substrate on one side of the second gate electrode.

To further achieve the above objects in a whole or in part, there is provided a memory device that includes a plurality of first gate electrodes and second gate electrodes formed on an active region of a substrate electrically separated from each other, a plurality of first ferroelectric capacitors each having a first electrode coupled to the substrate at one side of a corresponding one of the first gate electrodes, and a plurality of second ferroelectric capacitors each having a first electrode coupled to the substrate at one side of a corresponding one of the second gate electrodes and a first metal line electrically coupling the plurality of first gate electrodes, and a second metal line electrically coupling the plurality of second gate electrodes.

To further achieve the above objects in a whole or in part, there is provided a memory device that includes a semiconductor substrate having a plurality of pairs of a first active region and a second active region extending in a first direction asymmetric to, and spaced from each other, a first gate electrode on each of the first active regions of the substrate, and a second gate electrode on each of the second active regions of the substrate, a first insulating layer having first contact holes to expose the substrate on a first side of the first gate electrodes and second contact holes to expose the substrate on a first side of the second gate electrodes, first and second ferroelectric capacitors respectively stacked on a bottom surface and side surfaces of each of the first and second contact holes, a first split wordline on the second ferroelectric capacitors coupled to the first gate electrodes, a second split wordline on the first ferroelectric capacitors coupled to the second gate electrodes, a first bitline coupled to the substrate on a second side opposite the first side of the first gate electrodes and a second bitline coupled to the substrate on a second side of the second gate electrodes.

To further achieve the above objects in a whole or in part, there is provided a method for fabricating a memory device that includes defining a first active region and a second active region on a semiconductor substrate, forming a first gate electrode on the first active region of the substrate, and forming a second gate electrode on the second active region of the substrate, forming a first insulating layer having first and second contact holes to respectively expose the substrate on a first side of the first and second gate electrodes, forming ferroelectric capacitors, wherein first electrodes of the ferroelectric capacitors are in the contact holes and forming a first split wordline that is coupled to a second electrode of a second ferroelectric capacitor in the first contact hole and coupled to the first gate electrode, and forming a second split wordline that is coupled to a second electrode of a first ferroelectric capacitor in the second contact hole and coupled to the second gate electrode.

To further achieve the above objects in a whole or in part, there is provided a method for fabricating a nonvolatile ferroelectric memory that includes defining a first active region and a second active region on a semiconductor substrate, forming a first gate electrode on the first active region of the substrate, and forming a second gate electrode on the second active region of the substrate, forming a first insulating layer having contact holes to expose the substrate on a first side of the first and second gate electrodes, forming ferroelectric capacitors having first electrodes in the contact holes, respectively, forming ferroelectric layers and second electrodes respectively on the first electrodes, forming a first split wordline electrically coupled between the first gate electrode and the second electrode of the second ferroelectric capacitor, and forming a second split wordline electrically coupled between the second gate electrode and the second electrode of the first ferroelectric capacitor and forming a first bitline coupled to the substrate on a second side of the first gate electrode, and a second bitline coupled to the substrate on a second side of the second gate electrode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4a illustrates a related art nonvolatile ferroelectric memory;

FIG. 4b illustrates a cross-section along line I–I' of the related art nonvolatile ferroelectric memory in FIG. 4a;

DETAILED DESCRIPTION OF PREFERRED EMBODIMENTS

Reference will now be made in detail to the preferred embodiments of a semiconductor memory device and methods for fabricating the same according to the present invention, examples of which are illustrated in the accompanying drawings. Preferred embodiments according to the present invention reduce a RC delay of a split wordline in a nonvolatile ferroelectric memory to increase a speed of operations. According to preferred embodiments, at least one layer of shunt lines is provided between a gate electrode of a transistor and a lower electrode of a ferroelectric capacitor, and the shunt lines are electrically coupled outside of a cell region for using the shunt lines as one split wordline, which can significantly reduce a sheet resistance of the split wordline. Formation of the shunt lines before formation of the ferroelectric film can prevent degradation of the ferroelectric film. When forming a plurality of layers of shunt lines, each of the shunt lines are planarized after the formation of the shunt lines, which can form shunt lines having reduced widths, to form a small cell capable of increased integration.

Figure 1:
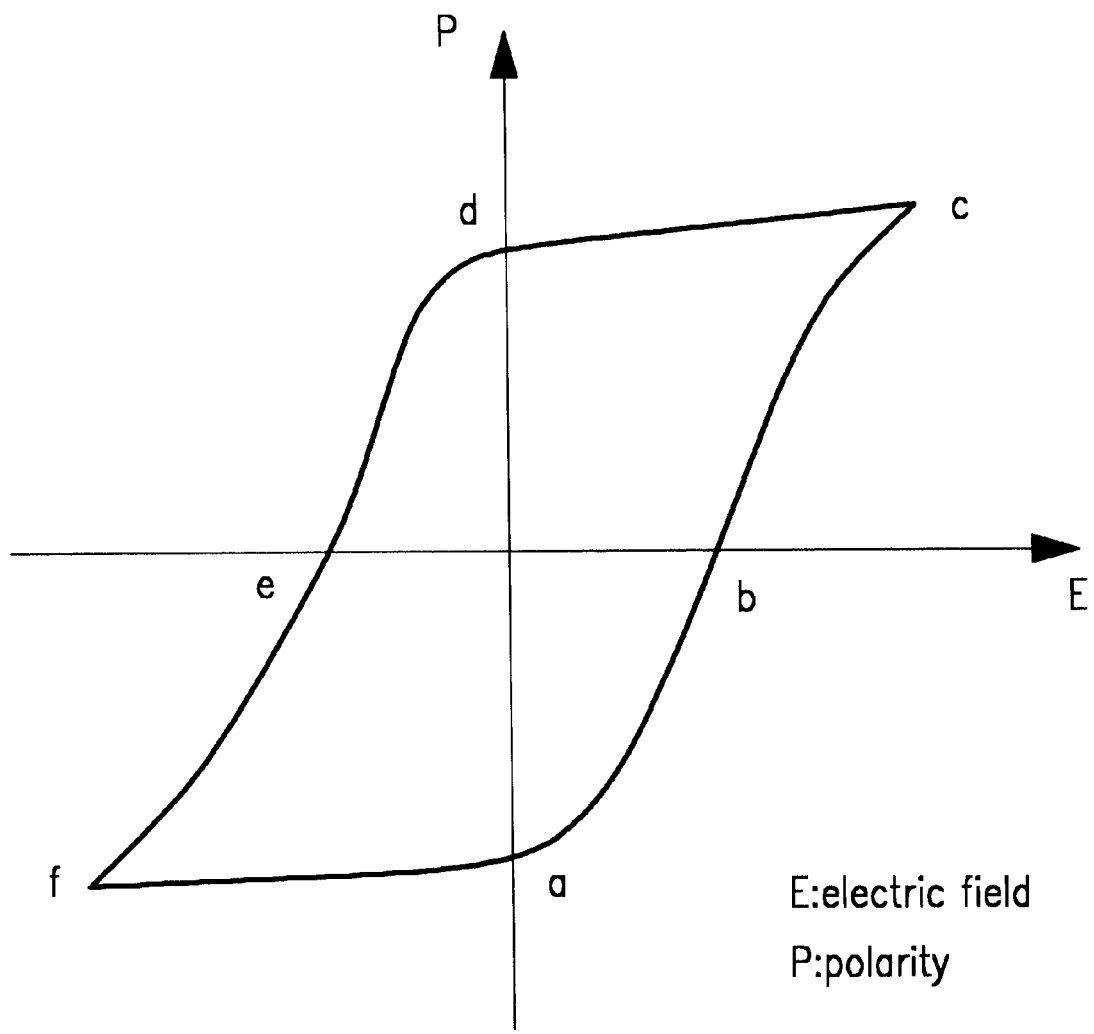
FIG. 1 illustrates a characteristic curve of a hysteresis loop of a ferroelectric.
Figure 2:
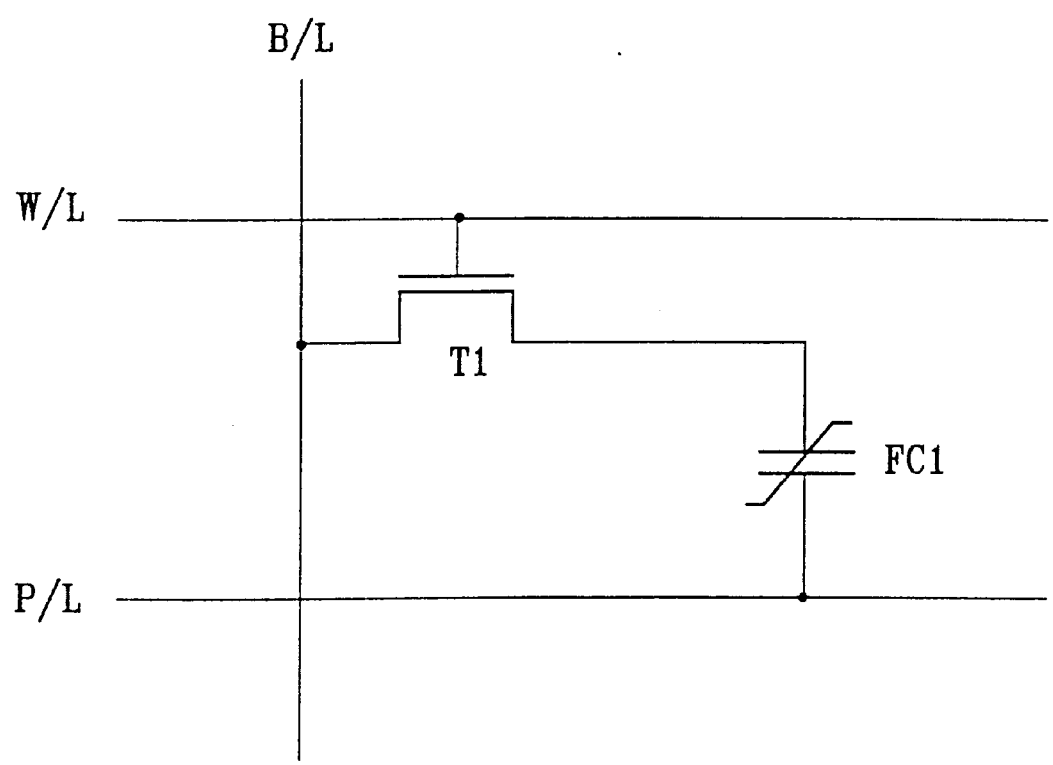
FIG. 2 illustrates a schematic view of a unit cell of a related art non-volatile ferroelectric memory unit cell.
Figure 3A:
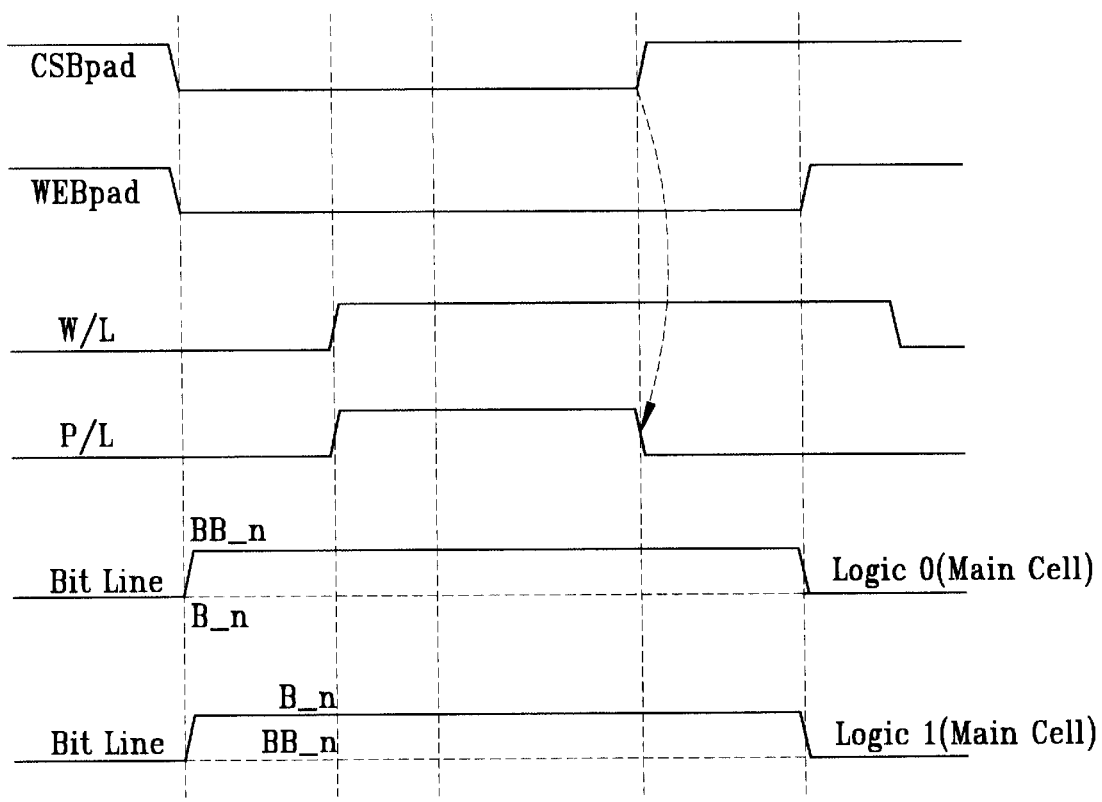
FIG. 3a illustrates a timing diagram of a write mode operation of the related art nonvolatile ferroelectric memory.
Figure 3B:
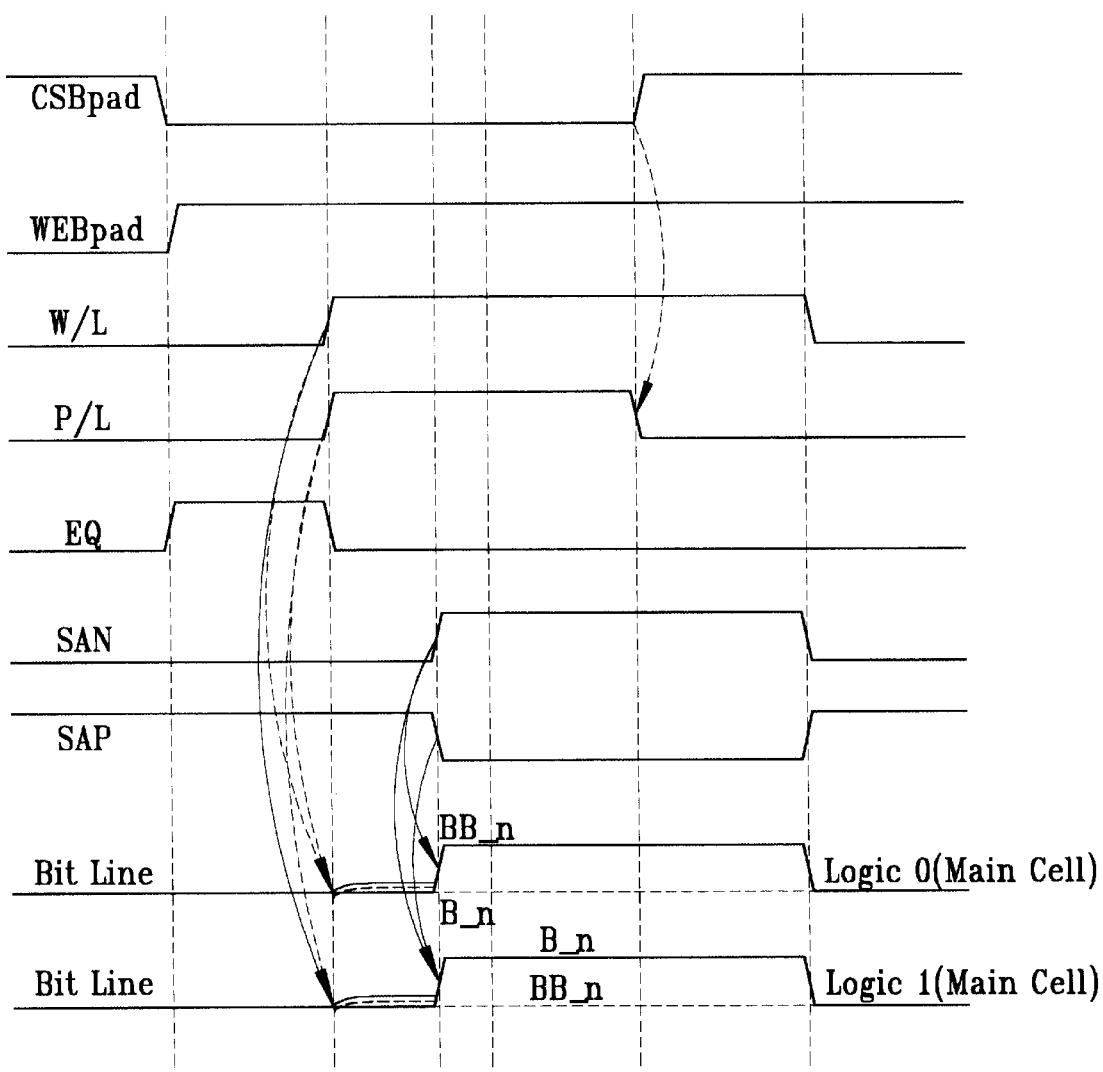
FIG. 3b illustrates a timing diagram of a read mode operation of the related art nonvolatile ferroelectric memory.
Figure 4B:
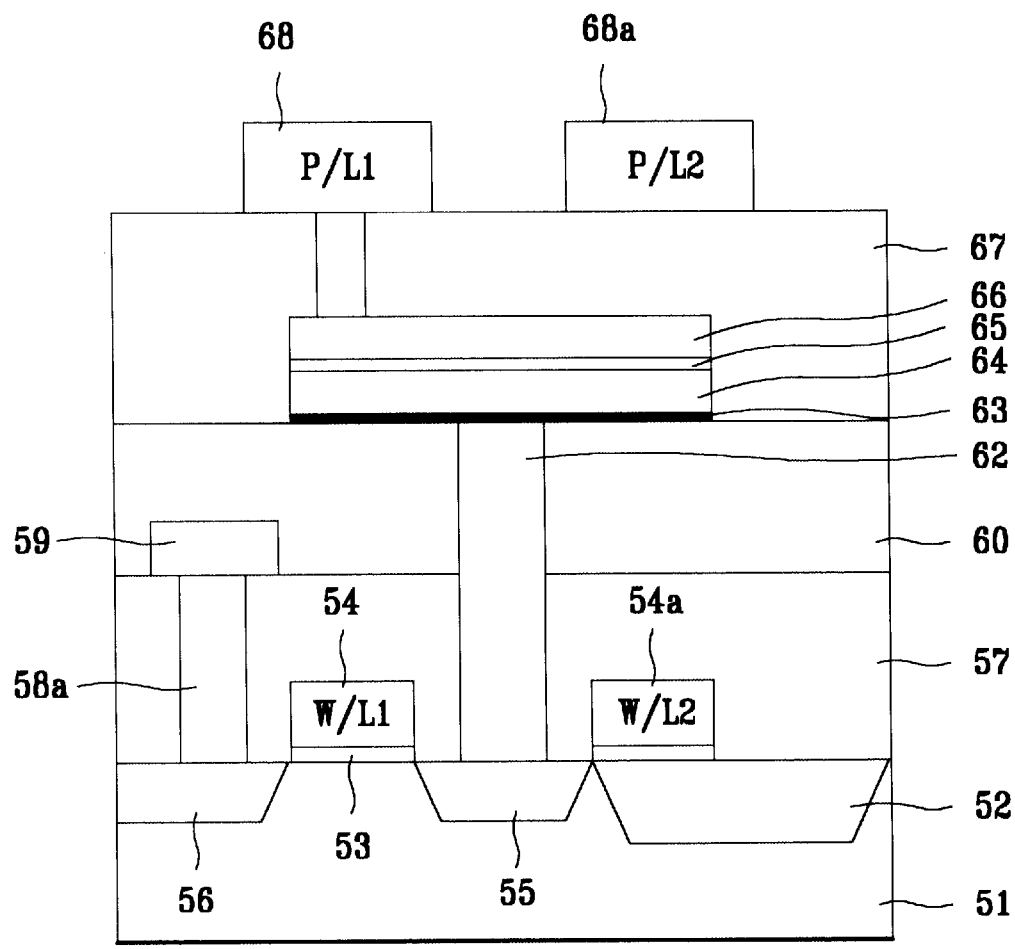
Figure 5A:
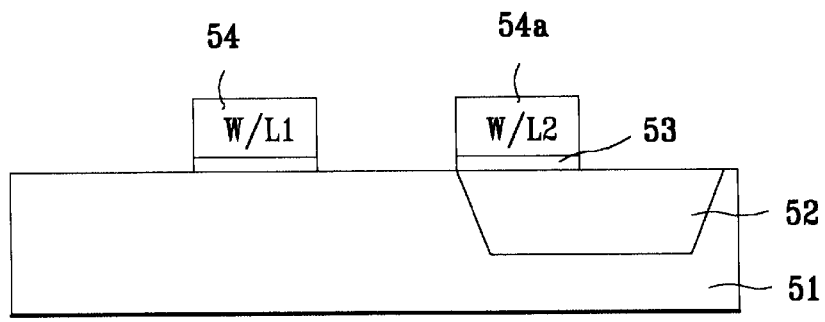
FIGS. 5a~5f illustrate cross-sections along line I–I' in FIG. 4a for describing a method for fabricating the related art nonvolatile ferroelectric memory.
Figure 5B:
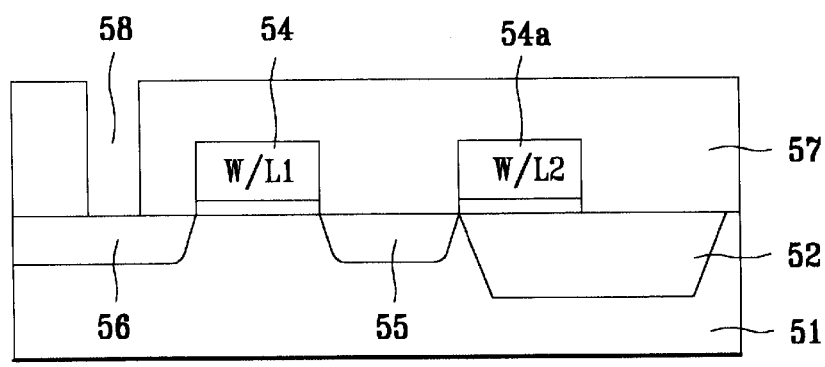
Figure 5C:
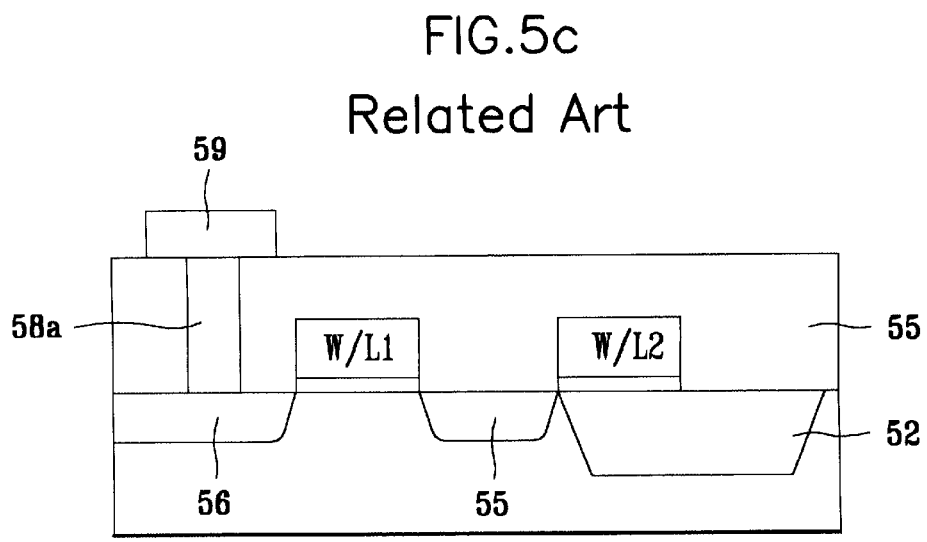
Figure 5D:
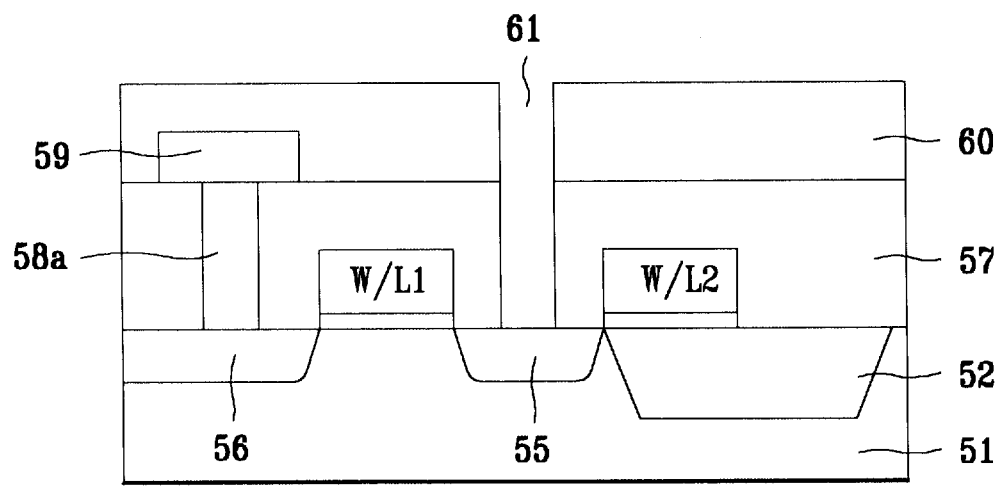
Figure 5E:
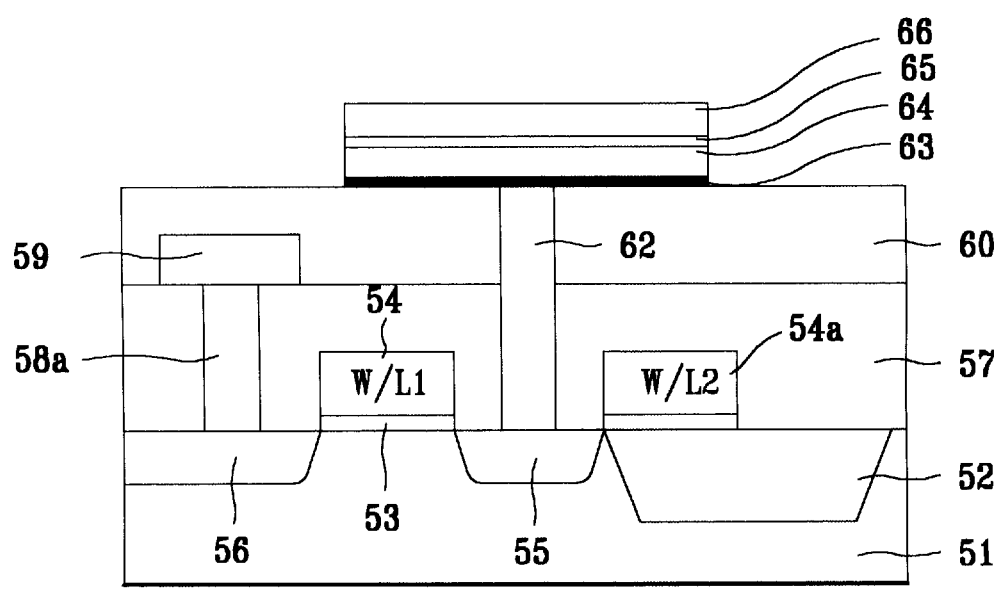
Figure 5F:
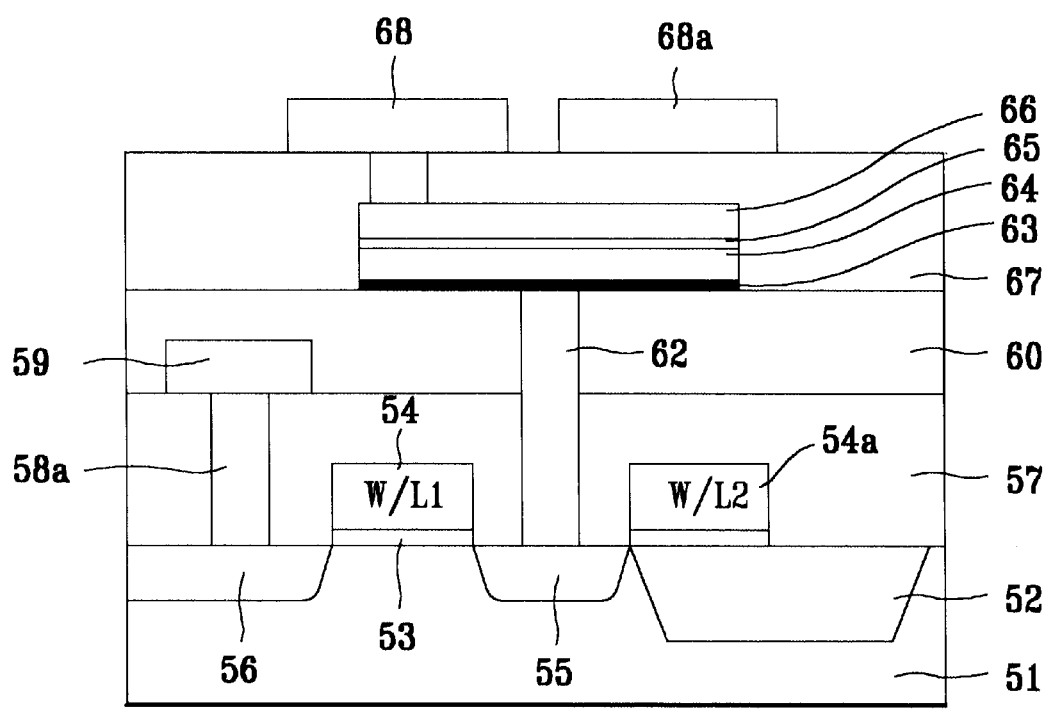
Figure 6:
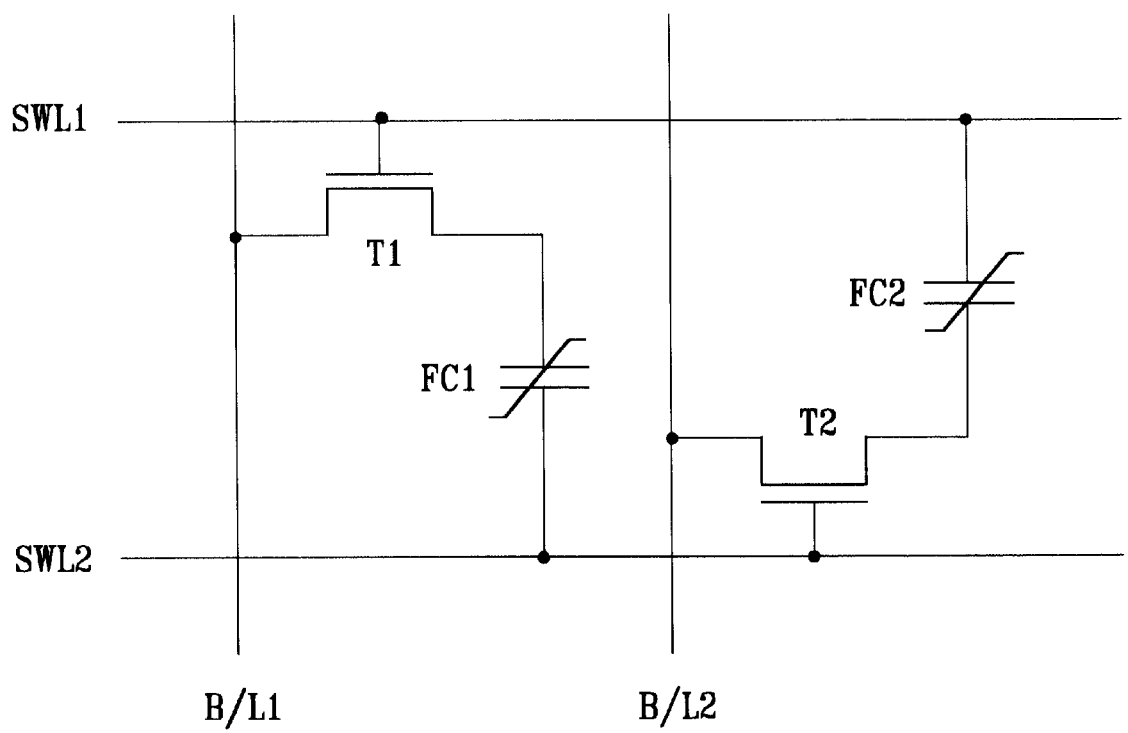
FIG. 6 is a diagram that illustrates a nonvolatile ferroelectric memory unit cell in accordance with preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across and preferably substantially perpendicular to the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array.

Figure 7:
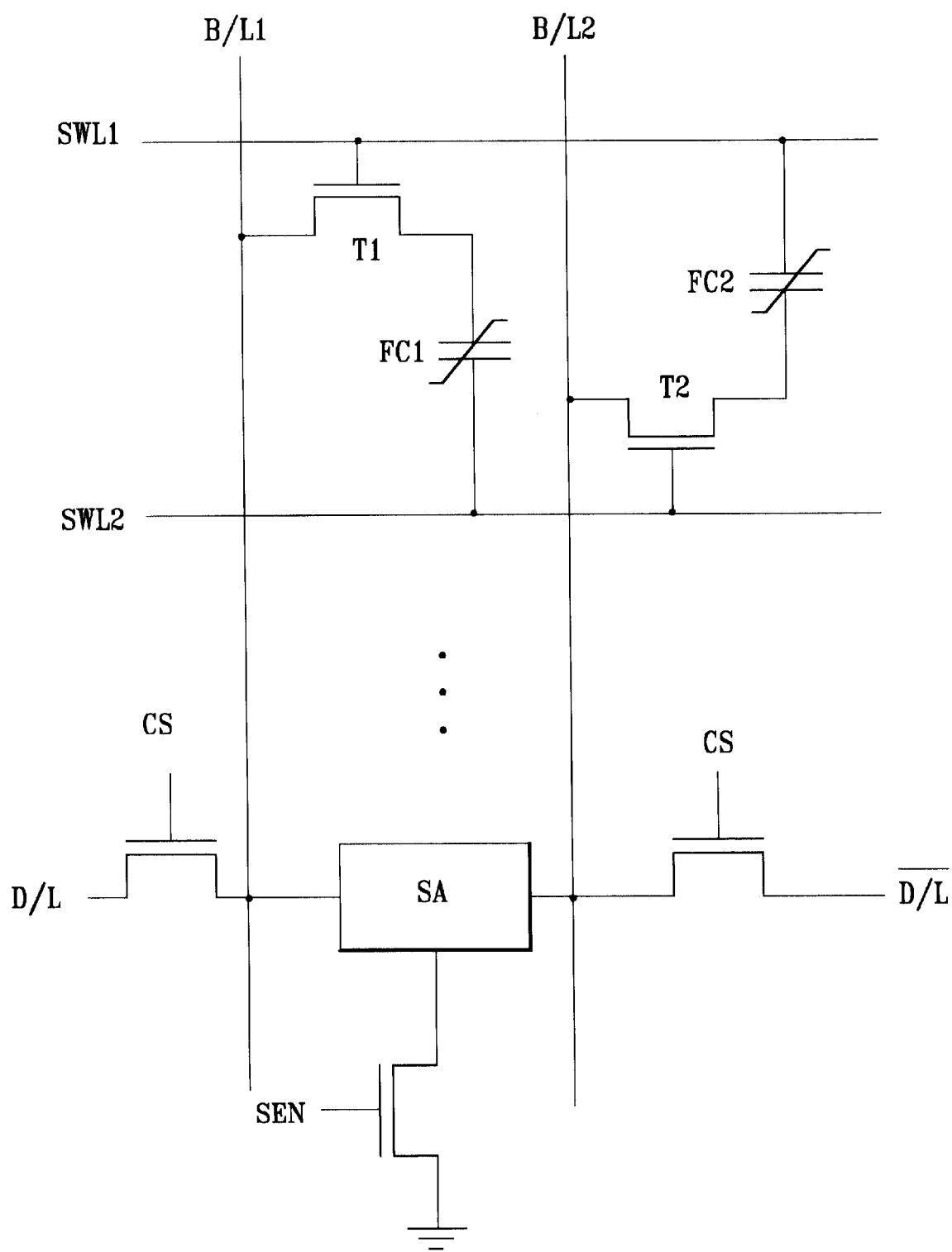
FIG. 7 is a diagram that illustrates a block diagram of preferred embodiments of a nonvolatile ferroelectric memory according to the present invention.

Operations of the nonvolatile ferroelectric memory device will now be described. FIG. 7 is a circuit diagram showing a nonvolatile ferroelectric memory device according to preferred embodiments of the present invention.

As shown in FIG. 7, a plurality of split wordline pairs including first and second split wordlines SWL1 and SWL2 in pairs are preferably formed in row direction. A plurality of bitlines B/L1 and B/L2 are formed across the split wordline pairs. Sensing amplifiers SA are formed between the respective bitlines to sense data transmitted through the bitlines and transfer the sensed data to a data line DL or a data bar line /DL. At this time, a sensing amplifier enable portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 8.

Figure 8:
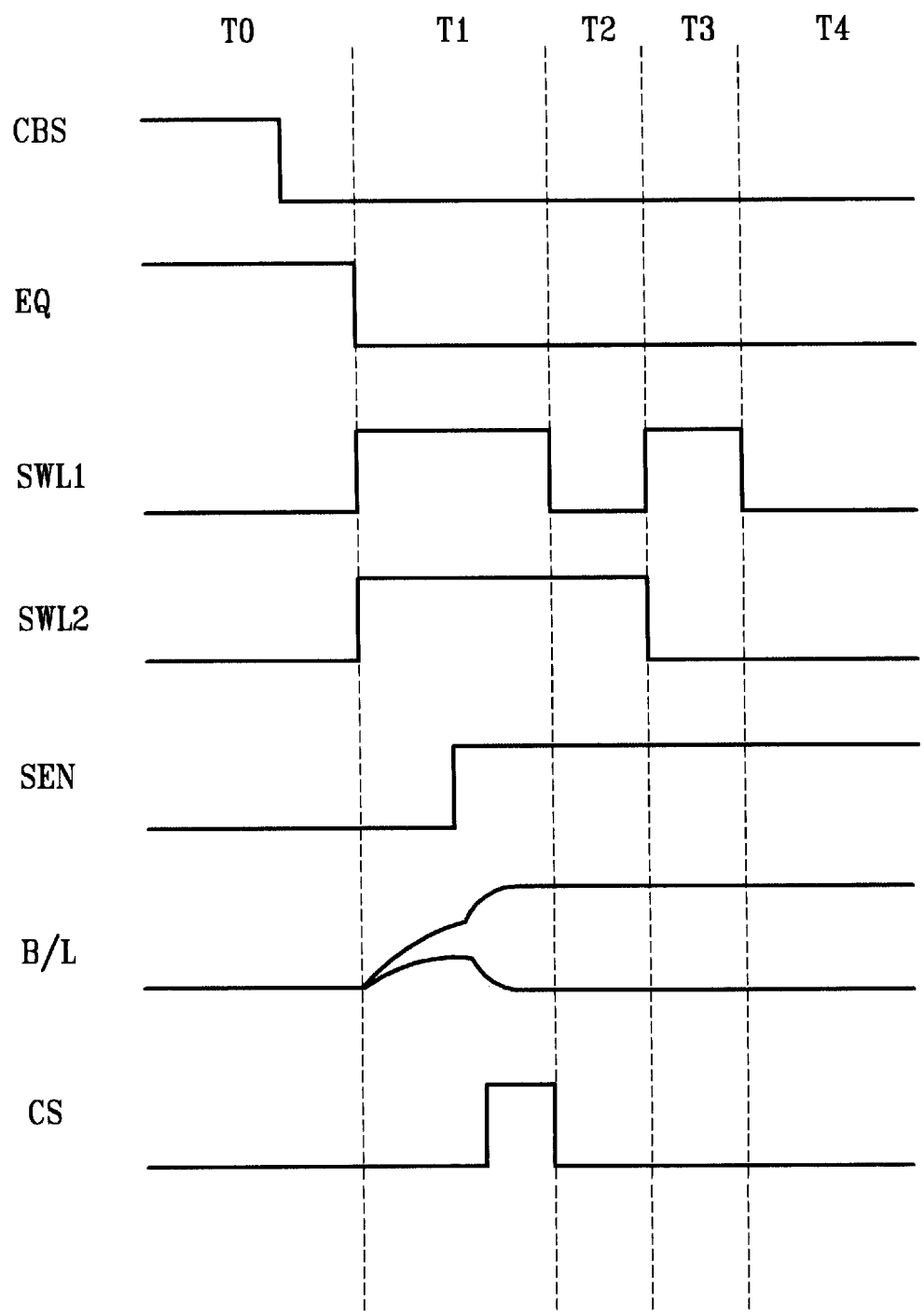
FIG. 8 is a diagram that illustrates a timing diagram for operations of preferred embodiments of a nonvolatile ferroelectric memory according to the present invention.

A T0 period in FIG. 8 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
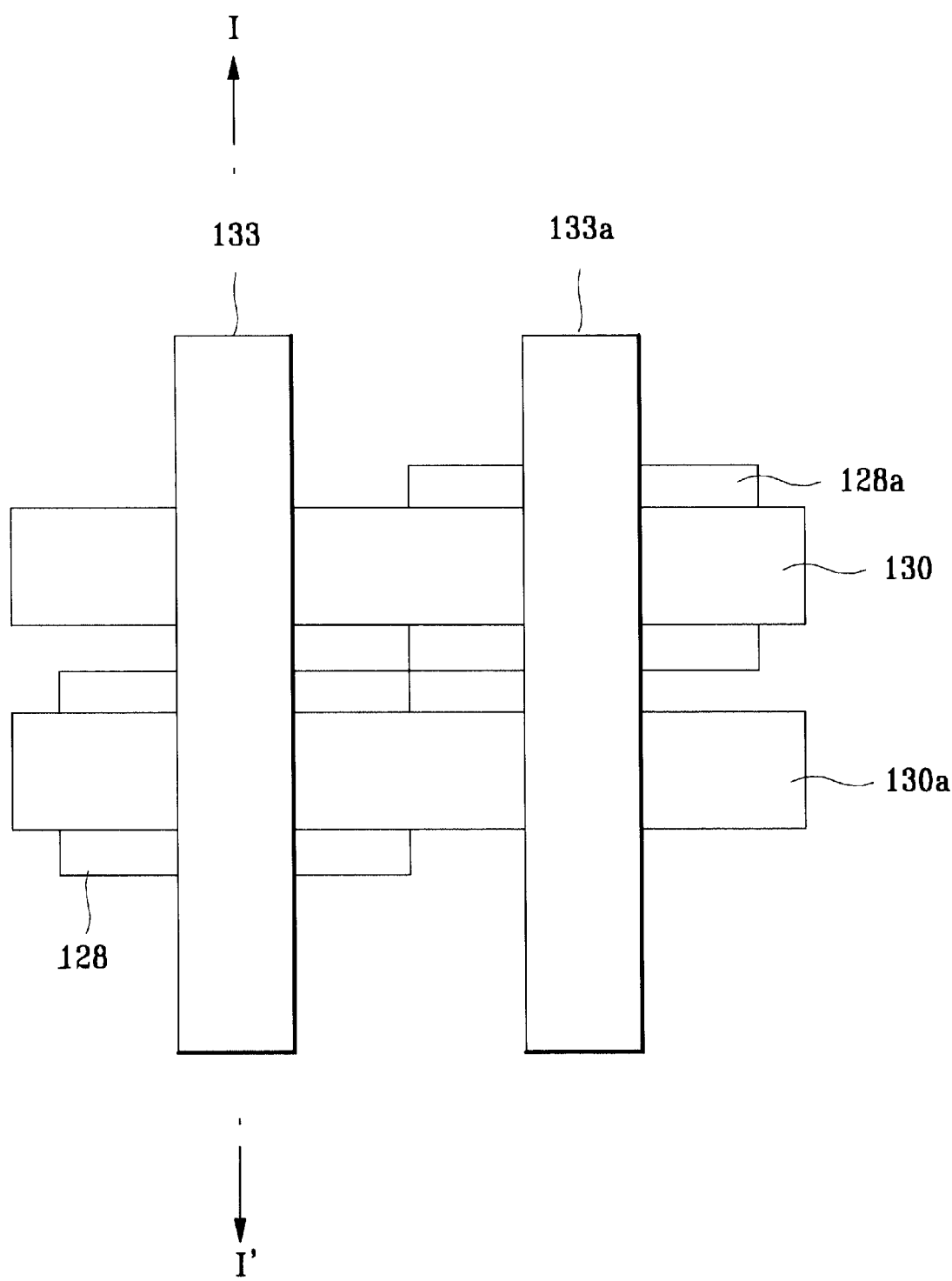
FIG. 9 is a diagram that illustrates a layout of a nonvolatile ferroelectric memory in accordance with a preferred embodiment of the present invention.
Figure 10:
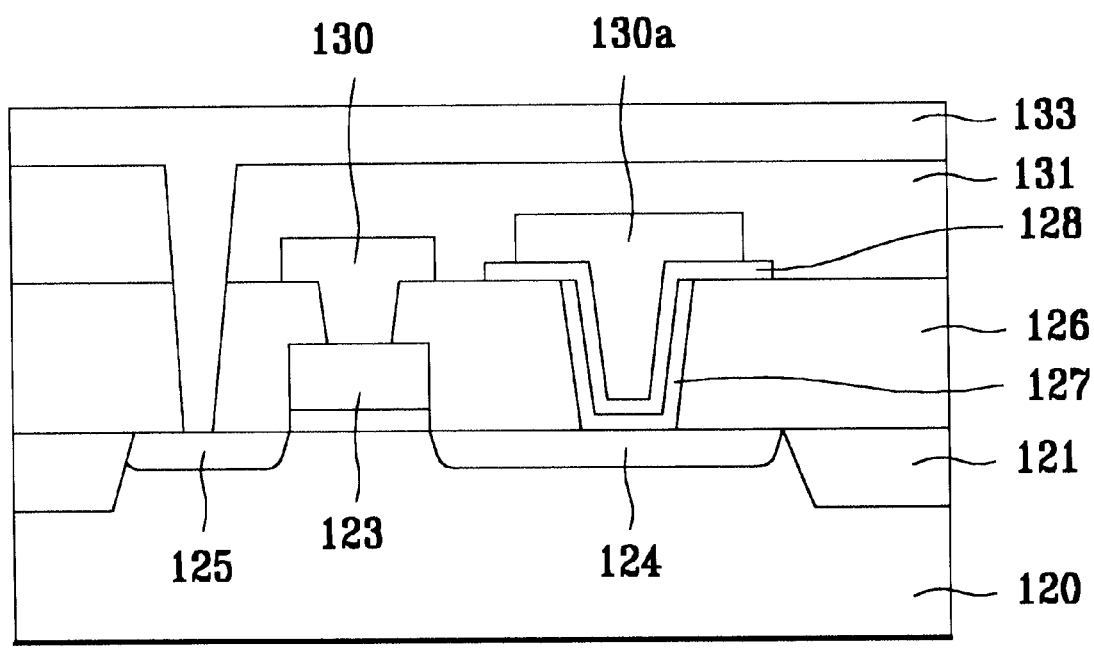
FIG. 10 is a diagram that illustrates a cross-section along line I–I' of FIG. 9.

A nonvolatile ferroelectric memory device and method for fabricating the same according to a first preferred embodiment of the present invention will now be described. FIG. 9 is a diagram that illustrates a layout of the first preferred embodiment of a nonvolatile ferroelectric memory in accordance with the present invention. As shown in FIGS. 9–10, the nonvolatile ferroelectric memory in accordance with the first preferred embodiment includes a first active region 100 (not shown), a second active region 100a (not shown) defined asymmetric to, and spaced from the first active region 100, a first gate electrode 123 formed on the first active region 100 of a substrate, a second gate electrode 123a formed on the second active region 100a of the substrate, a first electrode 127 of a first ferroelectric capacitor coupled to the substrate at one side of the first gate electrode 123, a first electrode 127a of the second ferroelectric capacitor coupled to the substrate at one side of the second gate electrode 123a, ferroelectric layers 128 and 128a respectively formed on the first electrodes 127, 127a, a first metal line 130 that is a second electrode of the second ferroelectric capacitor coupled to the first gate electrode 123, and a second metal line 130a that is a second electrode of the first ferroelectric capacitor coupled to the second gate electrode 123a. A first bitline 133 is formed in a direction crossing the first and second metal lines 130, 130a and coupled to the other side of the first gate electrode, and a second bitline 133a formed in a direction crossing the first and second metal lines and connected to the other side of the second gate electrode 123a. The first metal line 130 electrically couples the first gate electrode 123 and the second electrode of the second ferroelectric capacitor for serving as a first split wordline SWL1. The second metal line 130a electrically couples the second gate electrode 123a and the second electrode of the first ferroelectric capacitor for serving as a second split wordline SWL2.

FIG. 10 is a diagram that illustrates a cross-section of the first preferred embodiment of the nonvolatile ferroelectric memory in accordance with the present invention along line I–I' of FIG. 9. As shown in FIG. 10, the nonvolatile ferroelectric memory in accordance with the first preferred embodiment includes a semiconductor substrate 120 defined in a first active region and a field region 121, a first gate electrode 123 formed on the active region of the substrate, a first source region 124 and a first drain region 125 formed in the substrate on both sides of the first gate electrode 123, and a first insulating layer 126 having a first contact hole exposing the first gate electrode 123 and a second contact hole exposing the first source region 124. A first electrode 127 of the first ferroelectric capacitor is on an inside surface of the second contact hole, a ferroelectric layer 128 for use as the first ferroelectric capacitor is on the first electrode 127, and the first metal line 130 that is a second electrode of the second ferroelectric capacitor is coupled to the first gate electrode 123 through the first contact hole. A second metal line 130a is on the ferroelectric layer 128 for use as the second electrode of the first ferroelectric capacitor and is coupled to the second gate electrode 123a (not shown). A first bitline 133 is electrically coupled to the first drain region 125.

Though not shown in the drawing, there is a second active region separated from the first active region, wherein the second gate electrode (e.g., 123a) is on the second active region of the substrate. A first electrode of the second ferroelectric capacitor is coupled to a second source region on one side the second gate electrode, and there is a ferroelectric layer for use as the second ferroelectric capacitor on the first electrode. The second bitline (e.g., 133a) is coupled to the second drain region at one side of the second gate electrode. The first metal line 130 electrically couples the first gate line 123 and the second electrode of the second ferroelectric capacitor, and the second metal line 130a electrically couples the second gate electrode and the second electrode of the first ferroelectric capacitor. The first metal line 130 serves as a first split wordline SWL1 and the second metal line 130a serves as a second split wordline SWL2. Although the first preferred embodiment shown in FIGS. 9–10 has only one first gate electrode and only one second gate electrode as it is a layout for a unit cell, an actual cell array according to the first preferred embodiment has a plurality of the first gate electrodes and second gate electrodes. Accordingly, the first metal line 130 serves as a first split wordline SWL1 electrically coupling the first gate electrode 123 to other first gate electrodes disposed on the same wordline in a row direction, and the second metal line 130a also serves as a second split wordline SWL2 electrically coupling the second gate electrode to other second gate electrodes on the same wordline in the row direction. The nonvolatile ferroelectric memory according to the first preferred embodiment can further include a main and local wordline drivers, at least one decoder, at least one sensing amplifier, redundant row and column circuits and input/output circuits, etc.

A preferred embodiment of a method for fabricating the first preferred embodiment of the nonvolatile ferroelectric memory in accordance with the present invention will now be described. FIGS. 11a~11h are diagrams that illustrate layouts of the method for fabricating a nonvolatile ferroelectric memory in accordance with the first preferred embodiment of the present invention. FIGS. 12a~12h are diagrams that illustrate cross-sections along lines I–I' in FIGS. 11a~11h, respectively.

Figure 11A:
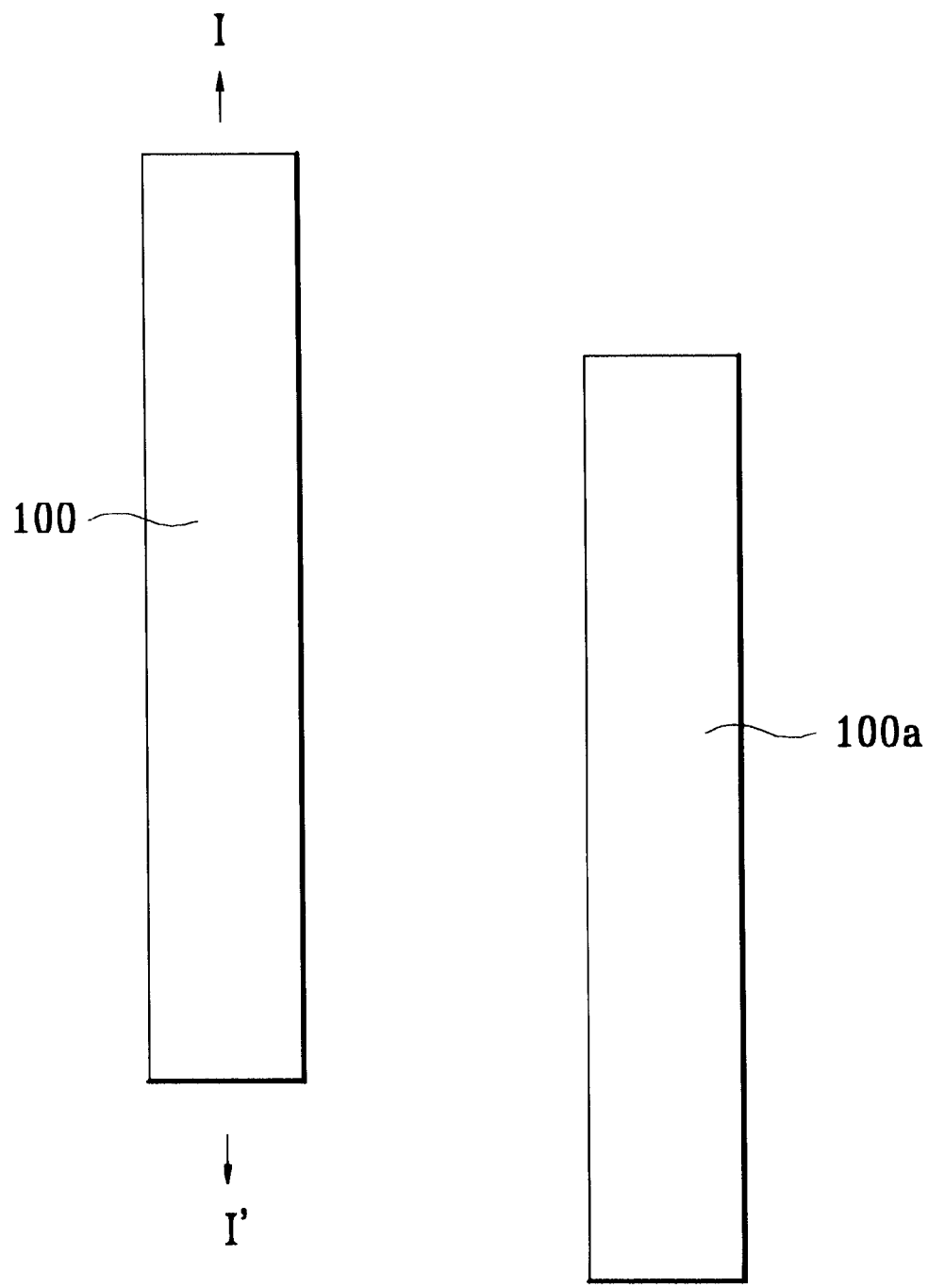
FIGS. 11a–11h are diagrams that illustrate layouts showing a method for fabricating a nonvolatile ferroelectric memory in accordance with a preferred embodiment of the present invention.
Figure 11B:
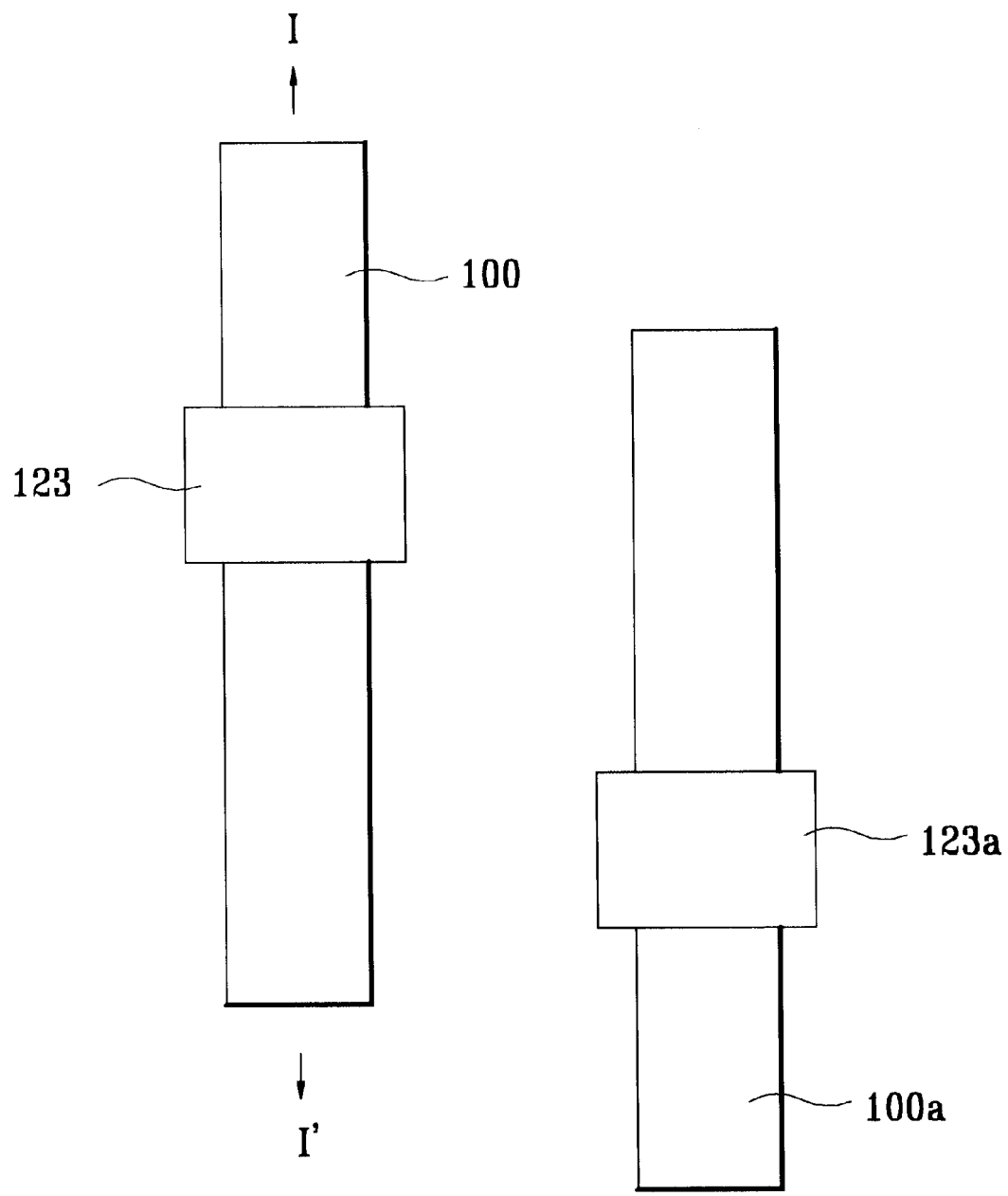

As shown in FIG. 11a, active regions 100 and 100a are defined, which are asymmetric and parallel to each other, preferably on a first conduction type semiconductor substrate. A region other than the active regions is preferably a field region (e.g., device isolation layer) that can be formed by trench isolation. As shown in FIG. 11b, a gate electrode material is deposited on an entire surface of the substrate inclusive of the active regions 100 and 100a and the remaining field region, and patterned to form a first gate electrode 123 and a second gate electrode 123a of the first transistor T1 and the second transistor T2. Impurity ions of a conduction type opposite to the substrate are implanted in the substrate (not shown) on both sides of the first gate electrode 123 to form first source/drain regions, second source/drain regions in the substrate on both sides of the second gate electrode 123a at the same time. Then, a first insulating layer (not shown) is formed on an entire surface inclusive of the first and second gate electrodes 123 and 123a, and contact holes are formed to expose the impurity regions (e.g., first and second source regions) at one side of respective gate electrodes 123 and 123a. A first conductive layer is formed for forming a first electrode of the ferroelectric capacitor on an entire surface inclusive of the contact holes. A barrier metal layer may be formed under the first conductive layer, for example, of TiN, $RuO_2$, $IrO_2$, or $PtSi_2$. The first conductive layer may be formed of Pt, Ir, or Ru or the like.

Figure 11C:
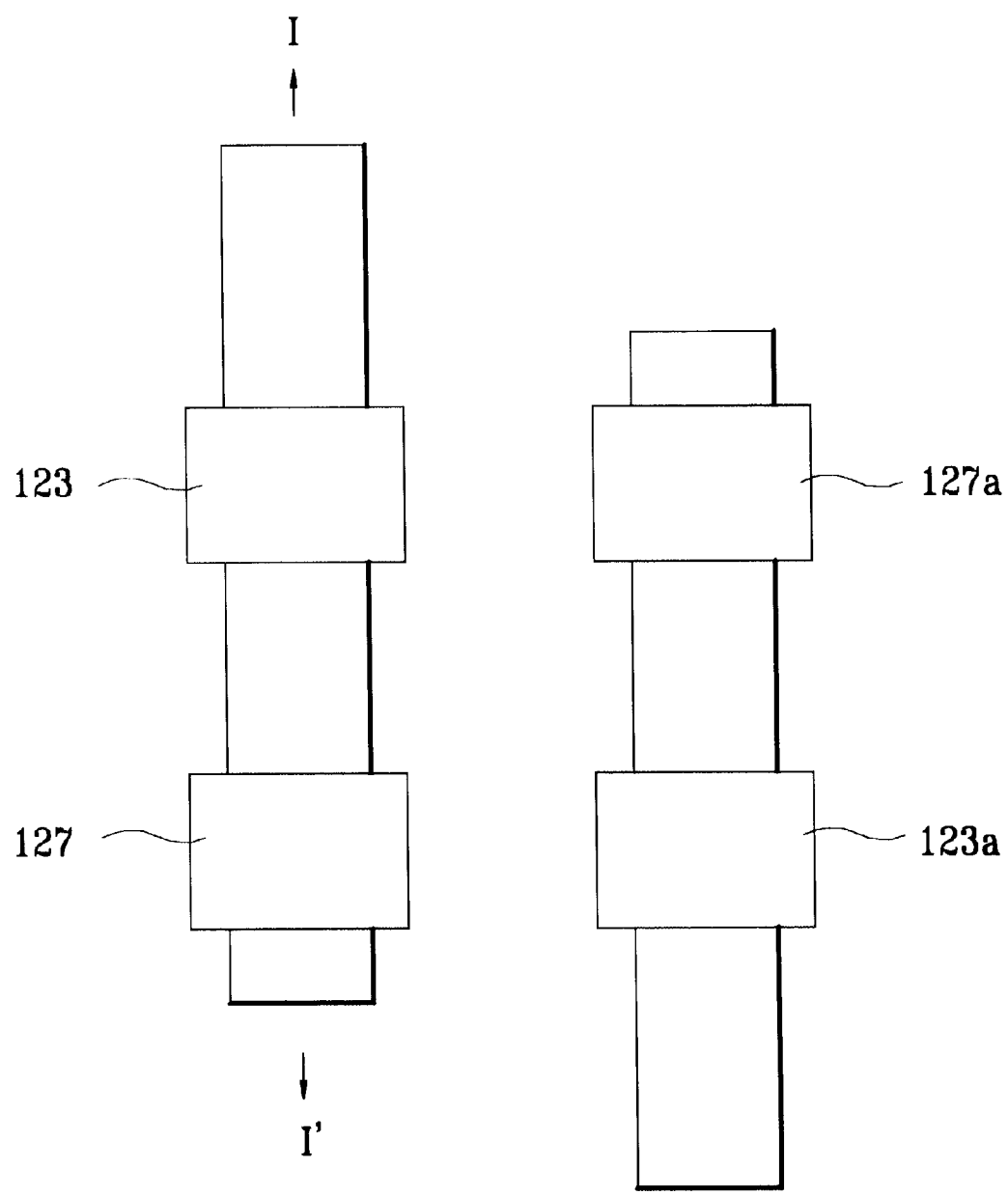
Figure 11D:
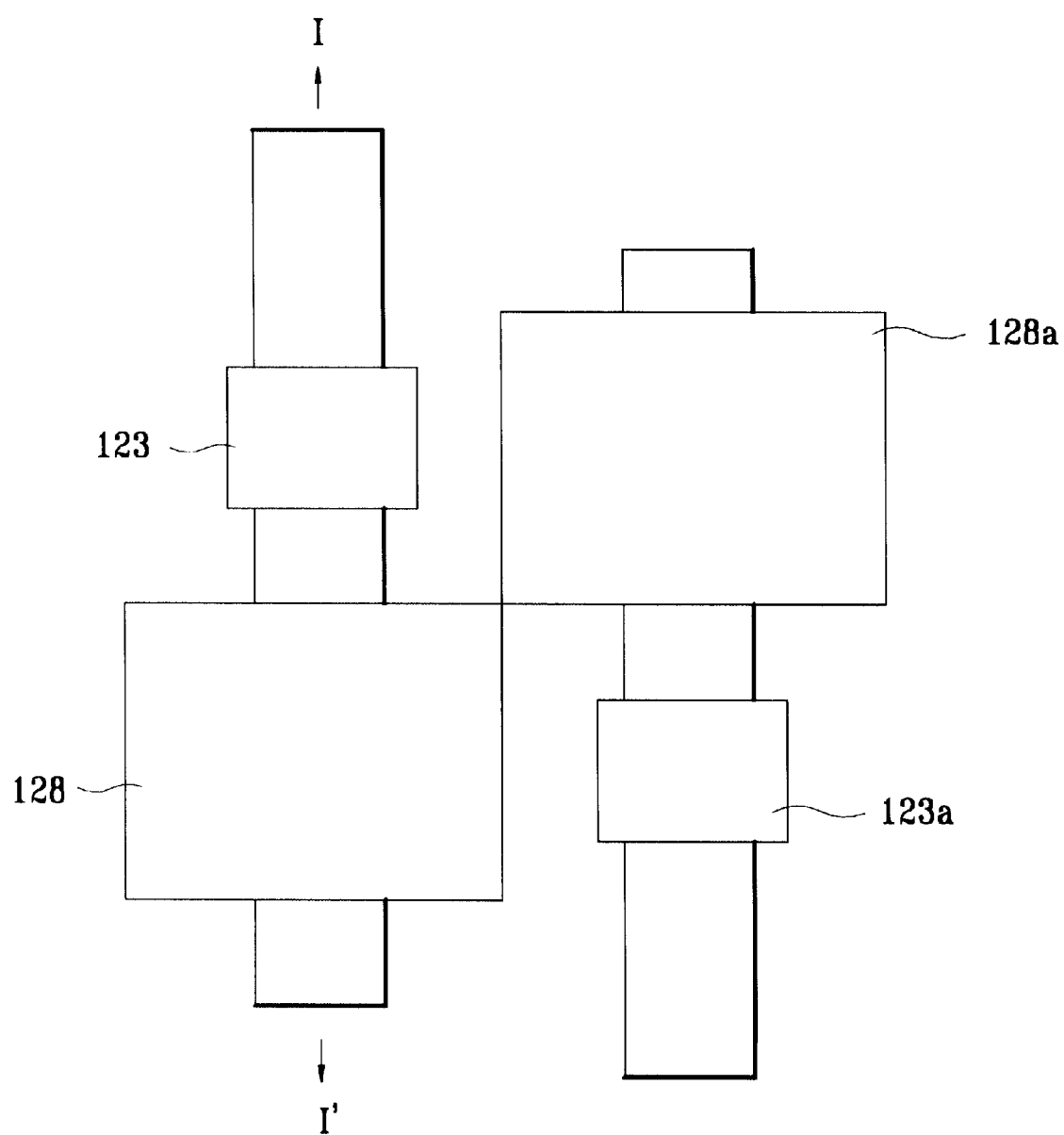

After forming the first conductive layer only or forming the first conductive layer on the barrier metal layer as shown in FIG. 11c, the first conductive layer is planarized to leave the first conductive layer only in the contact hole preferably by CMP or etch back to form a first electrode 127 of the first ferroelectric capacitor and a first electrode 127a of the second ferroelectric capacitor. As shown in FIG. 11d, a ferroelectric material layer is formed on an entire surface of the substrate inclusive of the first electrodes 127 and 127a of the ferroelectric capacitors and patterned to leave the ferroelectric material layer only on the first electrodes 127 and 127a, which preferably forms a ferroelectric layer 128 for the use as the first ferroelectric capacitor and a ferroelectric layer 128a for use as the second ferroelectric capacitor. In this instance, the ferroelectric layers 128 and 128a are patterned to have adequate areas enough to cover the first electrodes 127 and 127a.

Figure 11E:
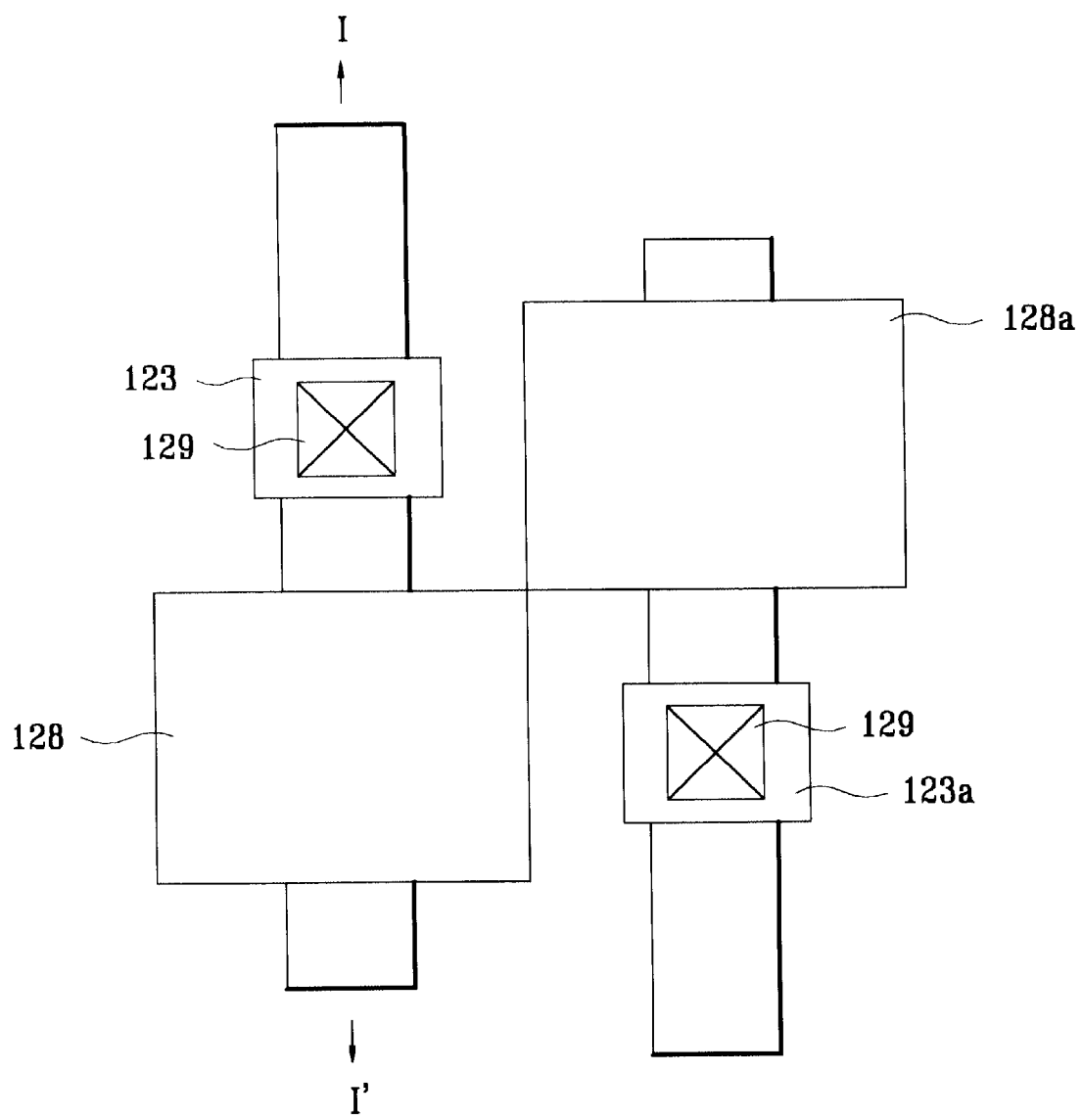
Figure 11F:
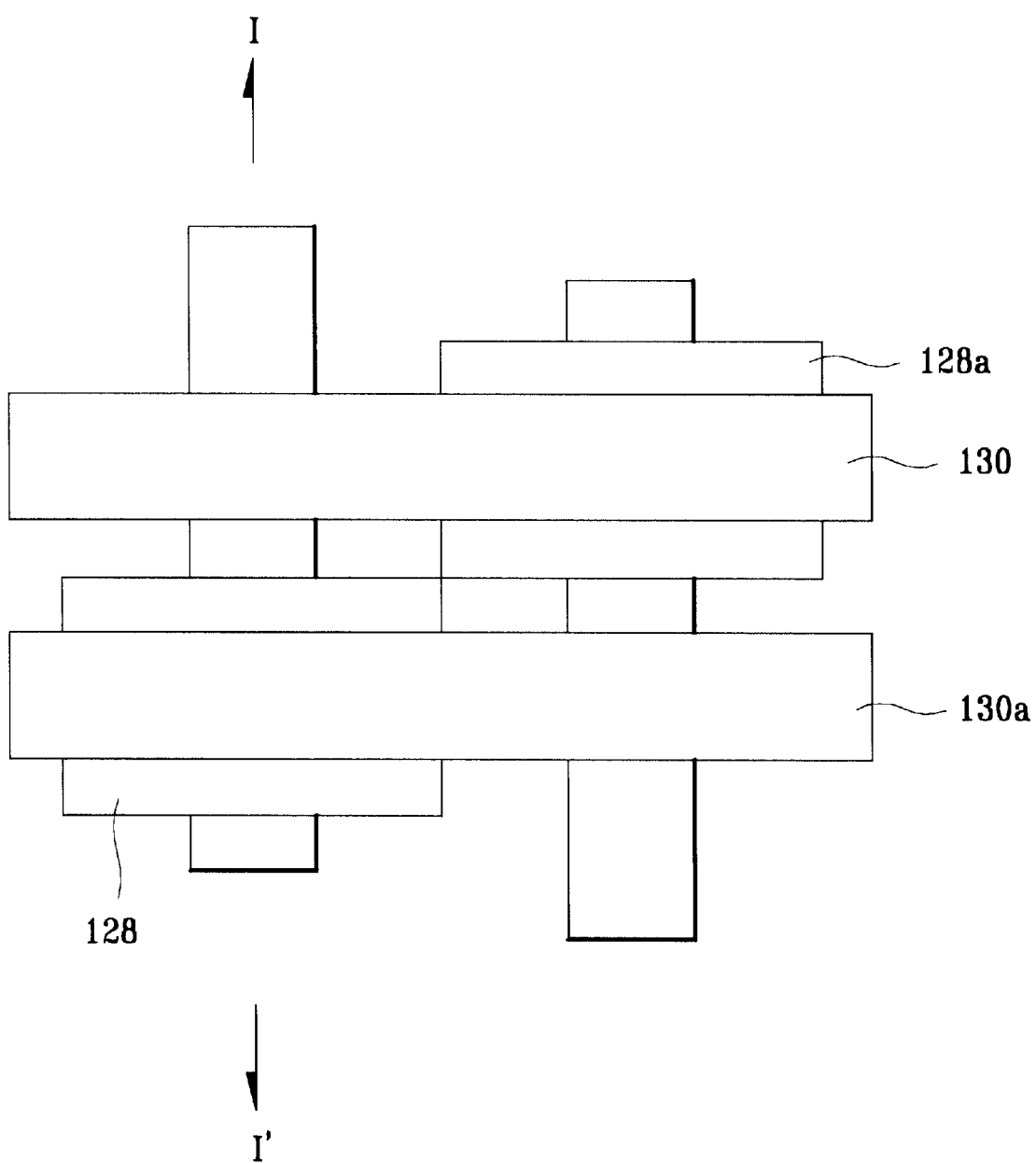

As shown in FIG. 11e, a photoresist layer (not shown) is coated on an entire surface inclusive of the ferroelectric layers 128 and 128a, and patterned by exposure and development. Then, the first insulating layer is etched until the first and second gate electrodes 123 and 123a are exposed, to form contact holes. As shown in FIG. 11f, a second metal layer is formed on the ferroelectric layers 128 and 128a inclusive of the contact holes, and patterned to form a first metal line 130 and a second metal line 130a. The first metal line 130 includes the second electrode of the second ferroelectric capacitor and is coupled to the first gate electrode 123, and the second metal line 130a includes the second electrode of the first ferroelectric capacitor and is coupled to the second gate electrode 123a. In this instance, the first metal line 130 serves as the first split wordline SWL1, and the second metal line 130a serves as the second split wordline SWL2. The first and second metal lines 130 and 130a are formed extending in a direction crossing the active regions.

Figure 11G:
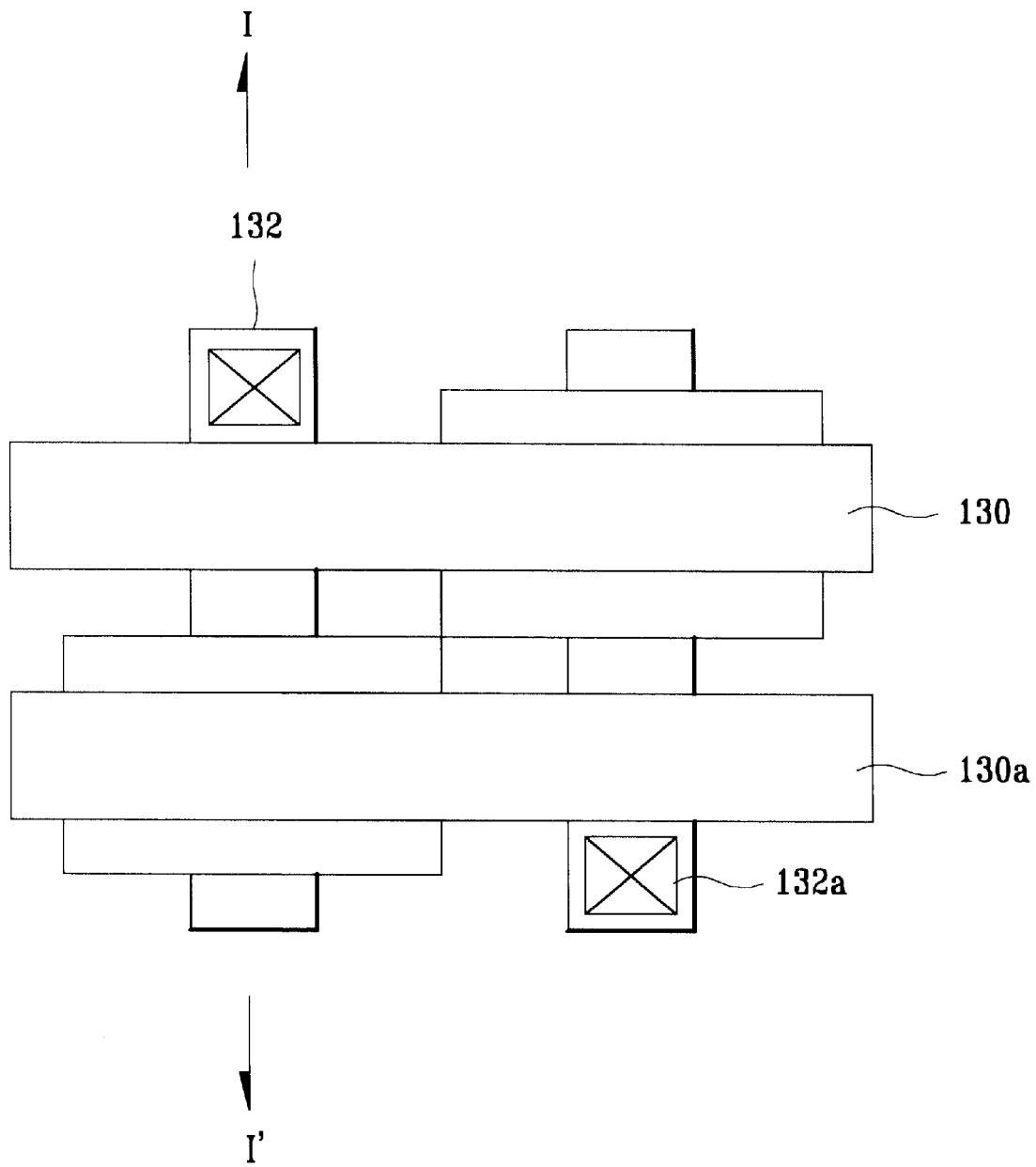

As shown in FIG. 11g, a second insulating layer (not shown) is formed on an entire surface of the substrate inclusive of the first and second metal lines 130 and 130a, and the second insulating layer and the first insulating layer are removed until the impurity regions (e.g., the first and second drain regions) on a second side of the first and second gate electrodes 123 and 123a are exposed to form first and second contacts 132 and 132a, respectively. The second and first insulating layers are removed preferably by etching using a photo process.

Figure 11H:
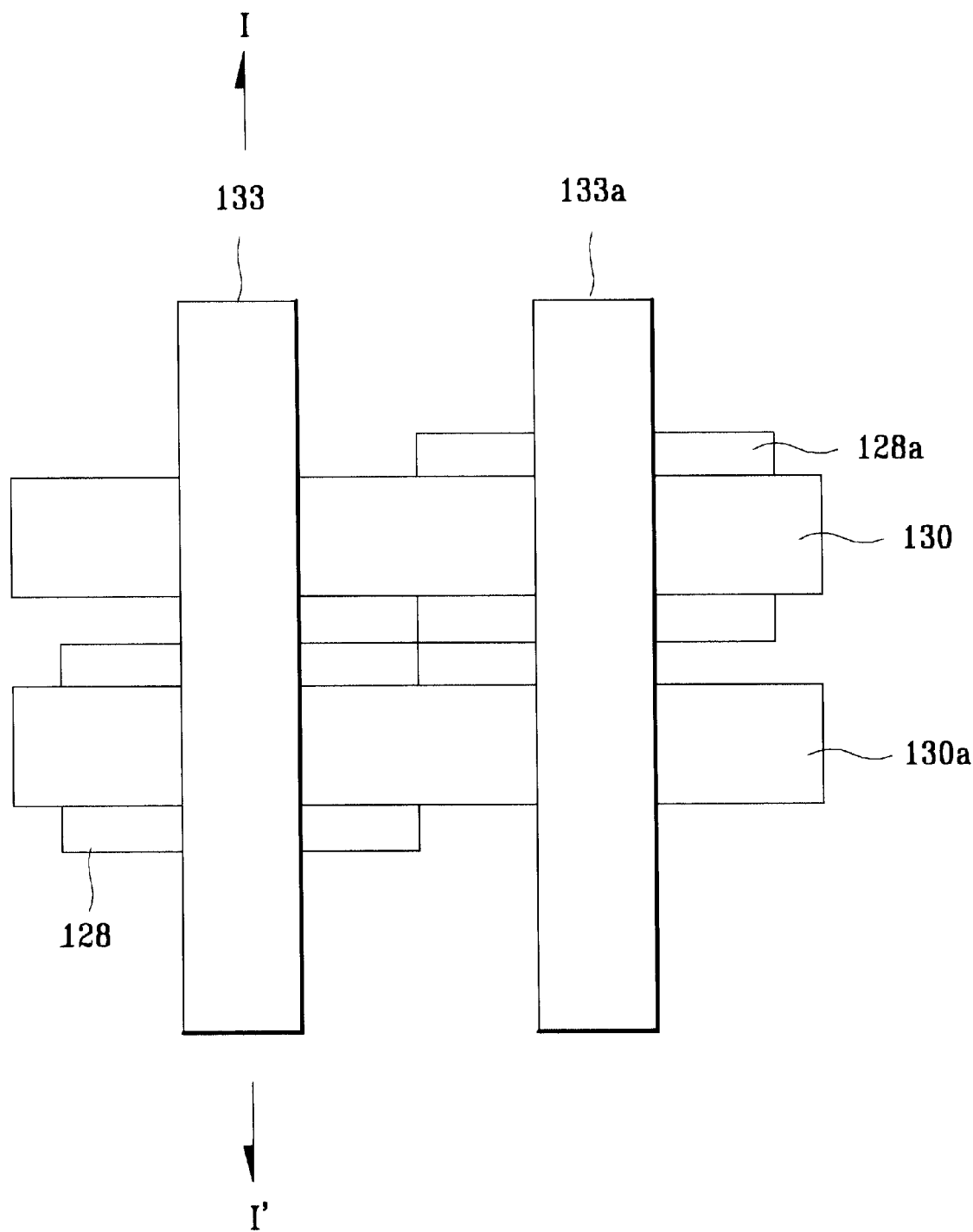

As shown in FIG. 11h, upon formation of first and second bitlines 133 and 133a to be in contact with the impurity regions through the first and second bitline contacts 132 and 132a, the first preferred embodiment fabrication process for a nonvolatile ferroelectric memory is completed.

Figure 12A:
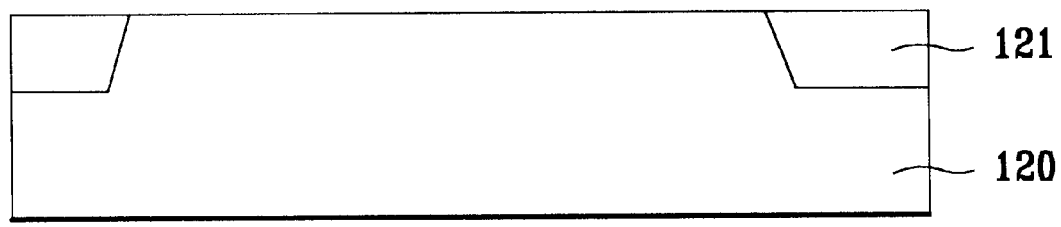
FIGS. 12a–12h are diagrams that illustrate cross-sections showing a method for fabricating a nonvolatile ferroelectric memory in accordance with a preferred embodiment of the present invention.
Figure 12B:
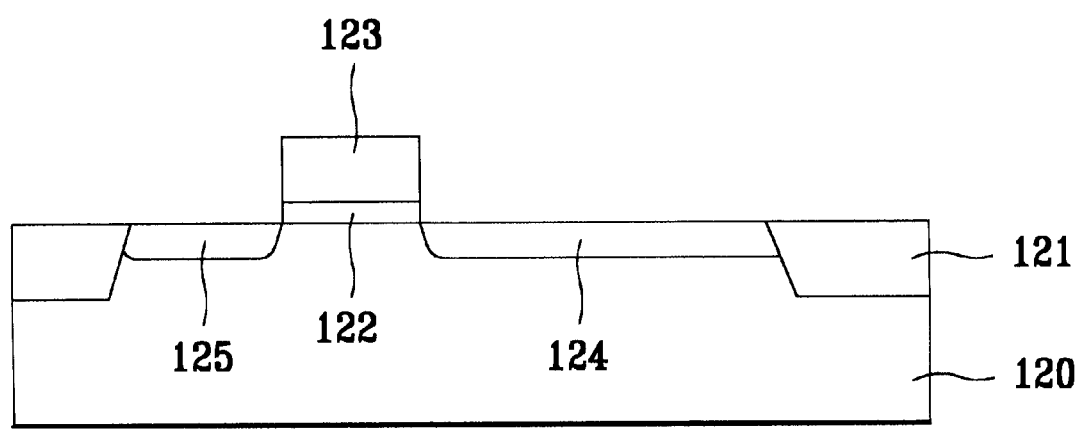

The preferred embodiment of a method for fabricating the first preferred embodiment of the nonvolatile ferroelectric memory will now be described using FIGS. 12a~12h. As shown in FIG. 12a illustrating a cross-section along line I–I' in FIG. 11a, a semiconductor substrate 120 is defined in active regions and a field region 121. The field region is preferably formed by trench isolation. As shown in FIG. 12b illustrating a cross-section along line I–I' in FIG. 11b, a first gate electrode 123 and a second gate electrode (not shown) are formed over the active regions and the field region of the substrate 120 with a gate insulating film 122 disposed inbetween. Then, the first gate electrode 123 and the second gate electrode 123a are used as masks in implanting impurity ions to form first source/drain regions 124 and 125 and second source/drain regions 124a and 125a (not shown) in the substrate on opposite sides of the gate electrodes 123, 123a, respectively.

Figure 12C:
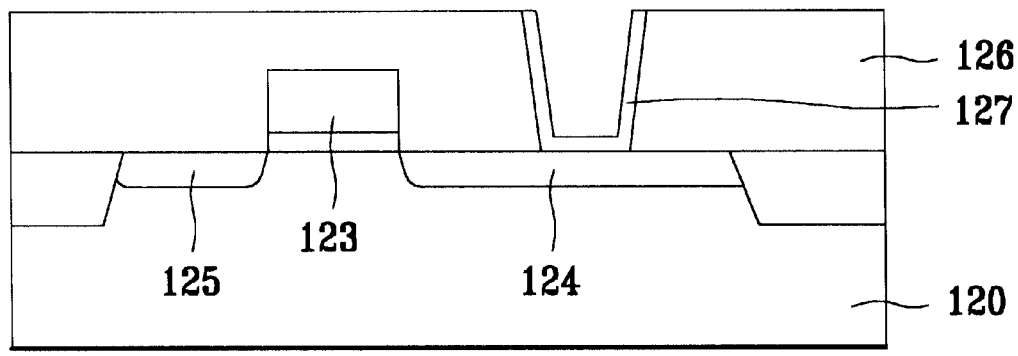

As shown in FIG. 12c illustrating a cross-section along line I–I' in FIG. 11c, a first insulating layer 126 is formed on an entire surface inclusive of the first gate electrode 123 and the second gate electrode 123a. The first insulating layer 126 is preferably an Inter Layer Dielectric (ILD) layer. Then, the first insulating layer 126 is preferably planarized by CMP, and removed to expose the first source region 124 and second source region 124a (not shown), to form contact holes. A first conductive layer is formed for use as the first electrodes of the ferroelectric capacitors on an entire surface inclusive of the first insulating layer 126, and a first electrode 127 of the first ferroelectric capacitor and a first electrode 127a (not shown) of the second ferroelectric capacitor are preferably formed by CMP or etch back. Only the first conductive layer may be formed of the first electrode material of the first ferroelectric capacitors, or alternatively, a barrier metal layer under the first conductive layer may be additionally formed. The first conductive layer may be formed of Pt, Ir, and Ru, and the barrier metal layer may be formed of TiN, $RuO_2$, $IrO_2$, or $PtSi_2$. The first conductive layer and the barrier metal layer/first conductive layer are preferably formed by sputter or CVD.

Figure 12D:
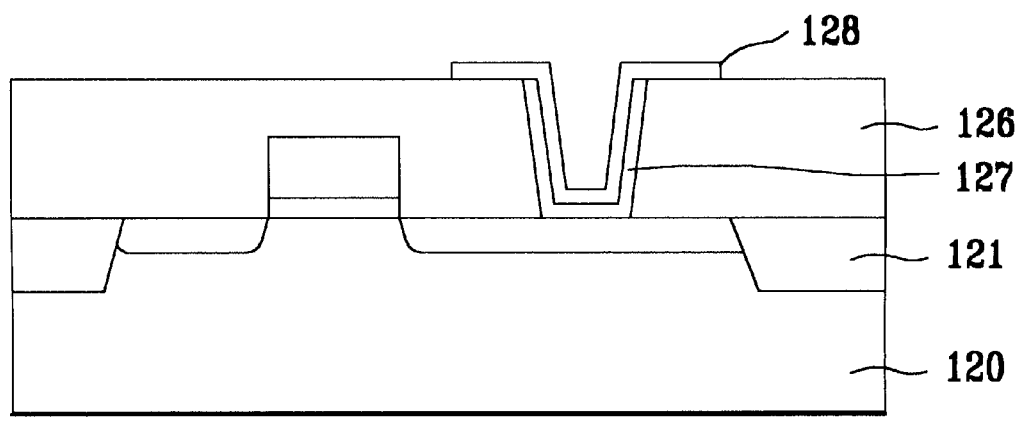
Figure 12E:
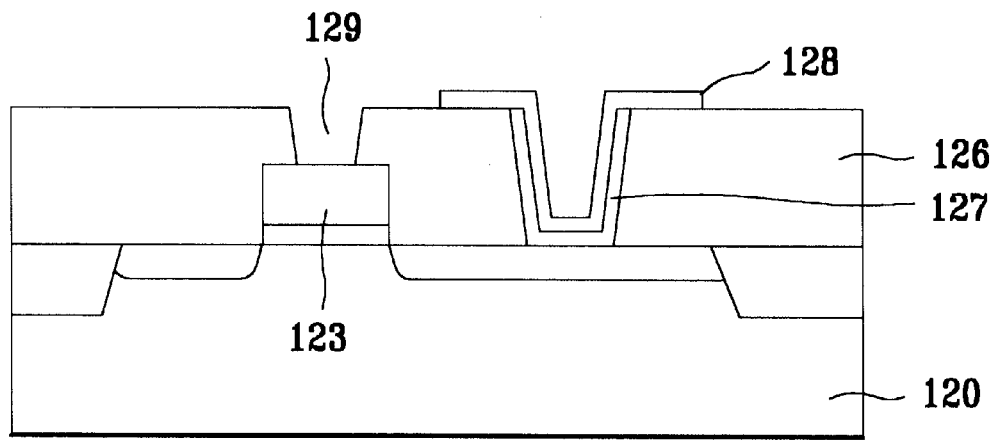

As shown in FIG. 12d illustrating a cross-section along line I–I' in FIG. 11d, a first ferroelectric layer 128 and a second ferroelectric layer 128a (not shown) are respectively formed on the first electrode 127 of the first ferroelectric capacitor and first electrode 127a (not shown) of the second ferroelectric capacitor to adequately cover the first electrode 127 of the first ferroelectric capacitor and first electrode 127a of the second ferroelectric capacitor. As shown in FIG. 12e illustrating a cross-section along line I–I' in FIG. 11e, a photoresist layer is coated on an entire surface of the substrate inclusive of the first ferroelectric layer 128 and the second ferroelectric layer, and etched by photo etching to form a contact hole 129 exposing an upper surface of the first gate electrode 123 and a contact hole (not shown) exposing an upper surface of the second gate electrode 123a (not shown).

Figure 12F:
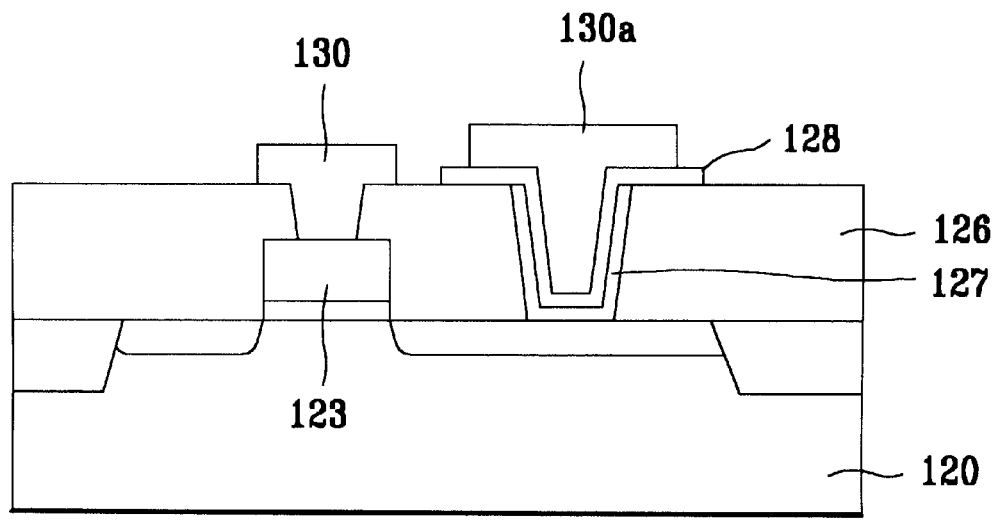

As shown in FIG. 12f illustrating a cross-section along line I–I' in FIG. 11f, a first metal line, which includes a second electrode of the second ferroelectric capacitor, coupled to the first gate electrode 123 through the contact hole 129, and a second metal line 130a, which includes a second electrode of the first ferroelectric capacitor, coupled to the second gate electrode 123a are formed. The first metal line 130 and the second metal line 130a are spaced a prescribed distance away from each other. As FIG. 12f shows only one unit cell including only one first gate electrode and second gate electrode. However, there are a plurality of first gate electrodes and a plurality of second gate electrodes in an actual cell array. Accordingly, the first metal line 130 serves as a first split wordline SWL1 electrically coupling the first gate electrode 123 to other first gate electrodes disposed on the same line in a row direction, and the second metal line 130a also serves as a second split wordline SWL2 electrically coupling the second gate electrode to other second gate electrodes on the same line in the row direction. The first and second metal lines 130 and 130a are formed in a direction crossing the active regions.

Figure 12G:
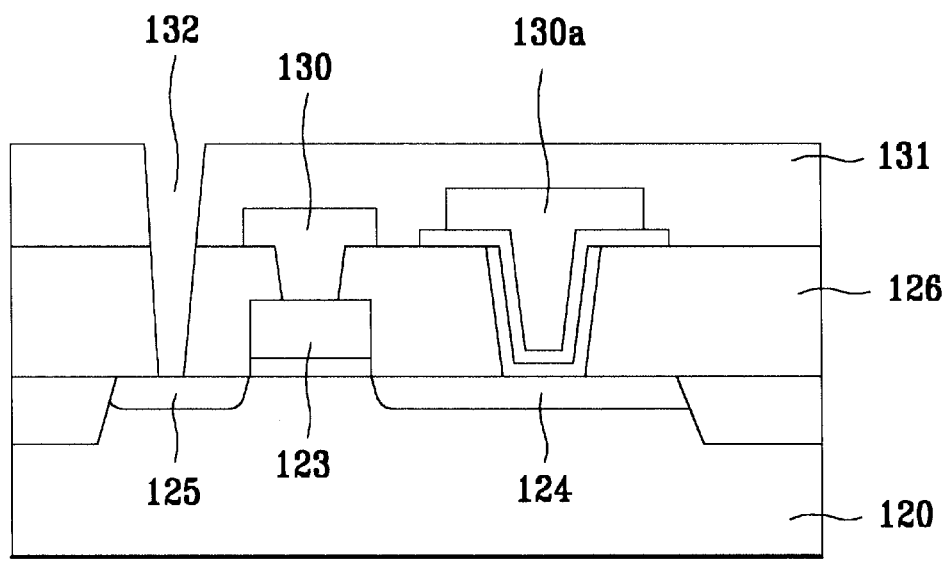

As shown in FIG. 12g illustrating a cross-section along line I–I' in FIG. 11g, a second insulating layer 131 is formed on an entire surface inclusive of the first and second metal lines 130 and 130a, and preferably planarized on an upper surface by CMP or etch back. Then, the second insulating layer 131 and the first insulating layer 126 are selectively etched until the first drain region 125 on one side of the first gate electrode 123 and the second drain region (not shown) on one side of the second gate electrode (not shown) are exposed, which respectively forms a first bitline contact 132 and a second bitline contact (not shown).

Figure 12H:
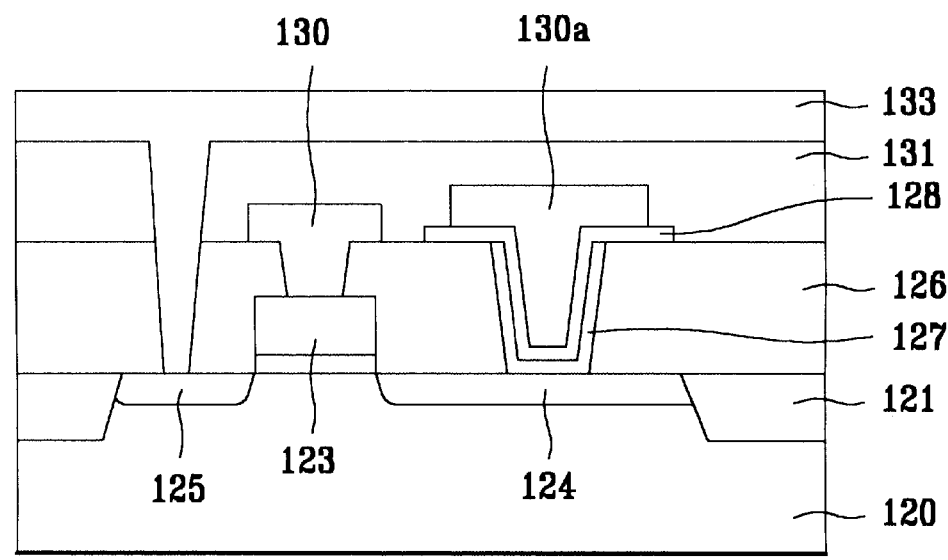

As shown in FIG. 12h illustrating a cross-section along line I–I' in FIG. 11h, upon formation of a first bitline 133 electrically coupled to the first drain region 125 through the first bitline contact 132 and extending in a direction crossing the first metal line 130, and upon formation of a second bitline (not shown) electrically coupled to the second drain region (not shown) through the second bitline contact (not shown), the process for fabricating a nonvolatile ferroelectric memory in accordance with the first preferred embodiment is completed.

Figure 13:
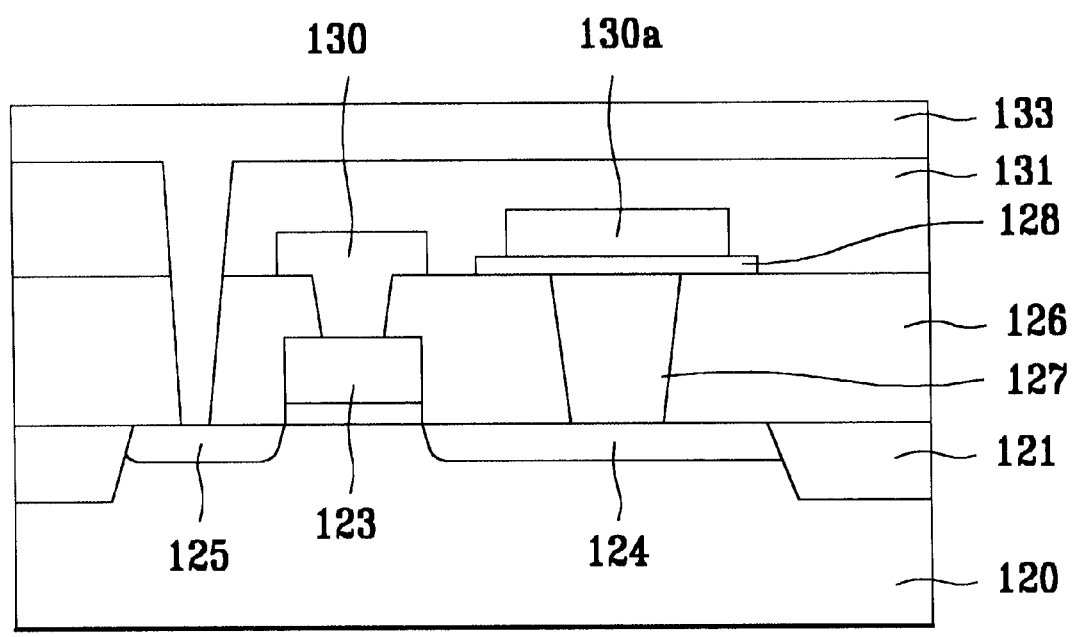
FIG. 13 is a diagram that illustrates a cross-section of a nonvolatile ferroelectric memory in accordance with another preferred embodiment of the present invention.

A nonvolatile ferroelectric memory and a method for fabricating the same in accordance with a second preferred embodiment of the present invention will now be described. FIG. 13 is a diagram that illustrates a cross-section of a nonvolatile ferroelectric memory in accordance with the second preferred embodiment. As a layout of the second preferred embodiment of the nonvolatile ferroelectric memory is similar to the first preferred embodiment, a description is omitted here.

As shown in FIG. 13, the nonvolatile ferroelectric memory in accordance with the second preferred embodiment of the present invention includes a semiconductor substrate 120 having a first active region and a field region 121, a first gate electrode 123 on the active region of the substrate, a first source region 124 and a first drain region 125 on opposing sides of the first gate electrode 123, and a first insulating layer 126 having a first contact hole exposing the first gate electrode 123 and a second contact hole exposing the first source region 124. A first electrode 127 of the first ferroelectric capacitor is provided in the second contact hole, and a ferroelectric layer 128 for use as the first ferroelectric capacitor is on the first electrode 127. A metal line 130, which includes a second electrode of the second ferroelectric capacitor, is coupled to the first gate electrode 123 through the first contact hole, and a second metal line 130a, which includes a second electrode of the first ferroelectric capacitor, is coupled to the second gate electrode (not shown). A first bitline 133 is electrically coupled to the first drain region 125. Although not shown in FIG. 13, there is a second active region separate from the first active region, on which a second gate electrode is formed. A first electrode of the second ferroelectric capacitor is coupled to the second source region on one side of the second gate electrode, and a ferroelectric layer for use as a second ferroelectric capacitor is on the first electrode. A second bitline is coupled to the second drain region on the other side of the second gate electrode. Therefore, the first metal line 130 electrically couples the first gate electrode 123 and second electrode of the second ferroelectric, capacitor, and the second metal line 130a electrically couples the second gate electrode and second electrode of the first ferroelectric capacitor. Preferably the first metal line 130 serves as the first split wordline SWL1, and the second metal line 130a serves as the second split wordline SWL2.

A preferred embodiment of a method for fabricating the nonvolatile ferroelectric memory in accordance with the second preferred embodiment of the present invention will now be described. FIGS. 14a~14h are diagrams that illustrate cross-sections describing the method for fabricating the nonvolatile ferroelectric memory in accordance with the second preferred embodiment of the present invention.

Figure 14A:
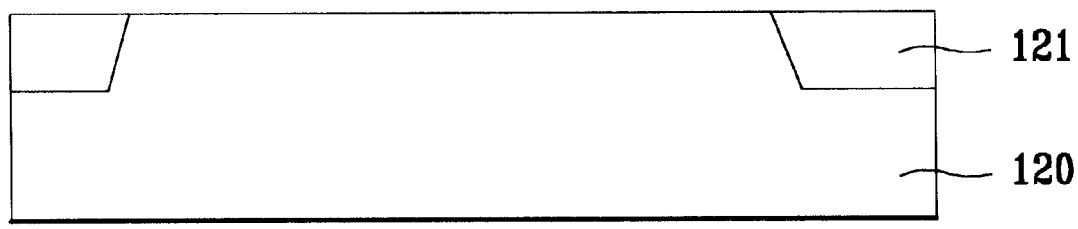
FIGS. 14a–14h are diagrams that illustrate cross-sections showing a method for fabricating a nonvolatile ferroelectric memory in accordance with another preferred embodiment of the present invention.
Figure 14B:
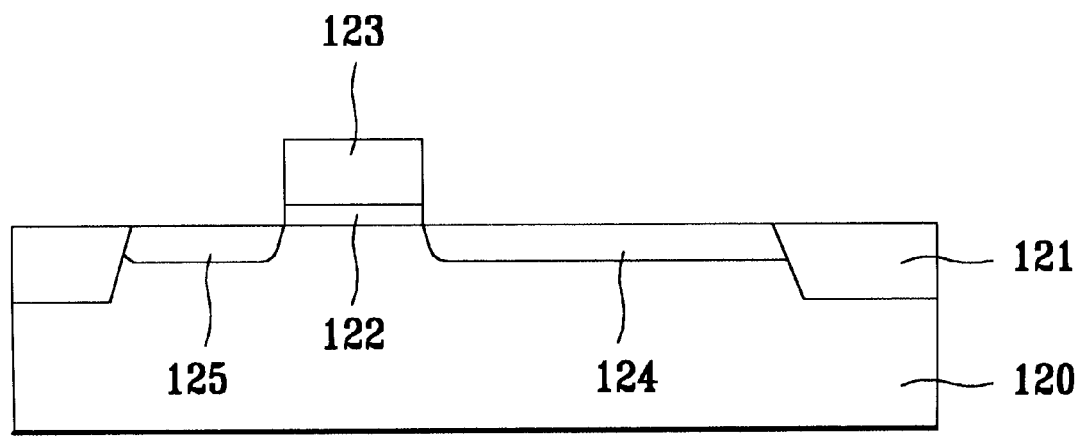

As shown in FIG. 14a, a semiconductor substrate 120 includes an active region and a field region 121. The field region is preferably formed by trench isolation. As shown in FIG. 14b, a first gate electrode 123 and a second gate electrode 123a (not shown) are formed on the active region and the field region of the substrate 120 with an insulating film 122 disposed inbetween. The first gate electrode 123 and the second gate electrode are used as masks in implanting impurity ions to form first source/drain regions 124 and 125, and second source/drain regions 124a and 125a (not shown) in the substrate on both sides of the first gate electrode 123 and the second gate electrode, respectively.

Figure 14C:
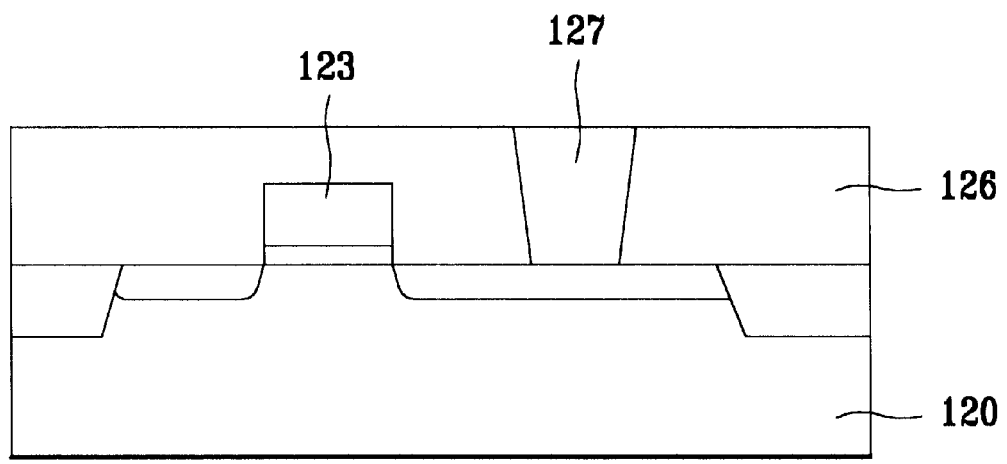

As shown in FIG. 14c, a first insulating layer 126 is formed on an entire surface inclusive of the first gate electrode 123 and the second gate electrode. The first insulating layer 123 is preferably an Inter Layer Dielectric (MD) layer. Then, the first insulating layer 123 is planarized by CMP, and removed to form contact holes exposing the first source region 124 and the second source region. A first conductive layer is formed on an entire surface inclusive of the first insulating layer 126 for use a first electrode of the ferroelectric capacitor preferably by a sol-gel process, and planarized by CMP, etch back or the like, to form the first electrode 127 of the first ferroelectric capacitor and the first electrode 127a (not shown) of the second ferroelectric capacitor. In the sol-gel process, the first conductive layer is deposited in a solid state by a solid state deposition method, and altered into a gel state, so that the first conductive layer is fully stuffed in the contact hole. The formation of the first conductive layer by CVD or sputtering is preferably similar to the first preferred embodiment to form the conductive layer, not stuffed in the contact hole, but along an inside surface of the contact hole. Further, a barrier metal layer may be formed before the first conductive layer is formed. The first conductive layer is preferably formed of Pt, Ir, Ru, and the barrier metal layer of TiN, $RuO_2$, $IrO_2$, or $PtSi_2$. When, the first conductive layer is formed after the barrier metal layer is formed, the barrier metal layer is formed by CVD or sputtering, and the first conductive layer is still formed by sol-gel.

Figure 14D:
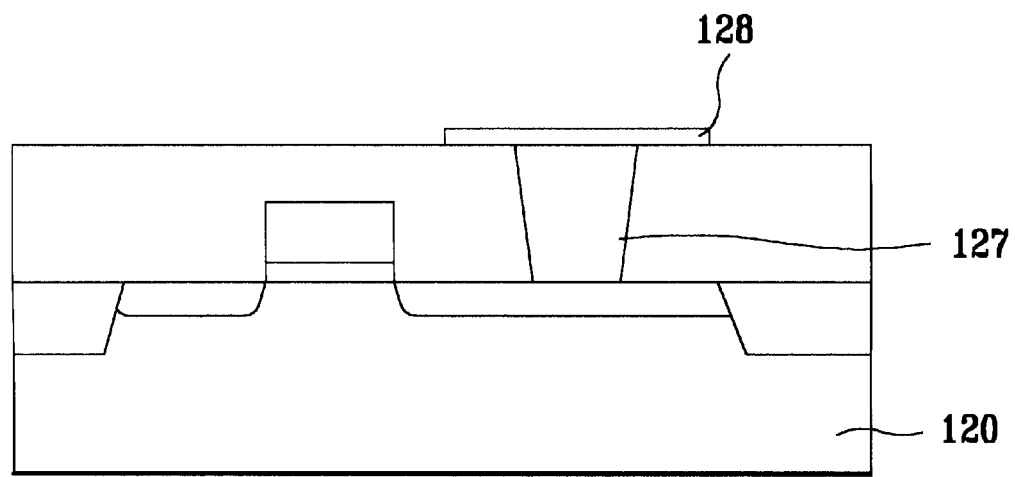
Figure 14E:
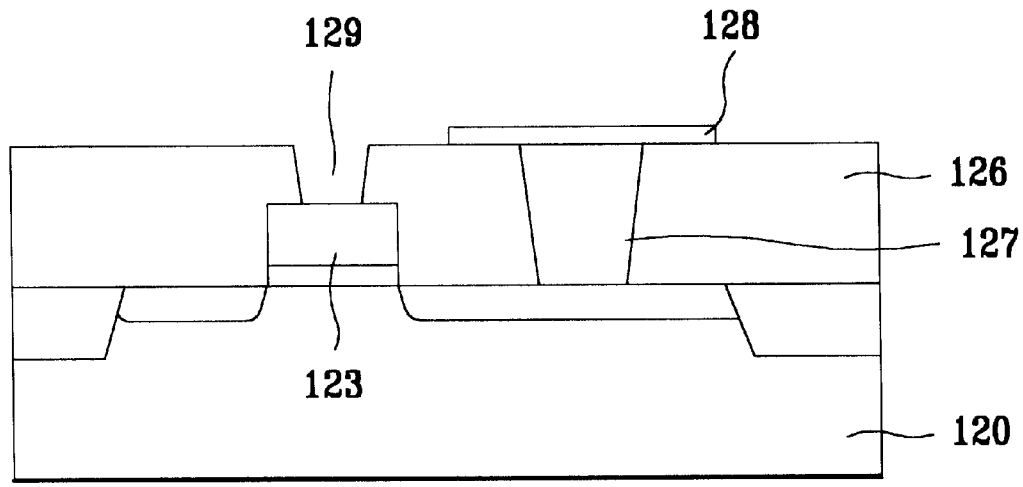

As shown in FIG. 14d, a first ferroelectric layer 128 and a second ferroelectric layer 128a (not shown) are formed on the first electrode 127 of the first ferroelectric capacitor and the first electrode (not shown) of the second ferroelectric capacitor to sufficiently cover the first electrode 127 of the first ferroelectric capacitor and the first electrode (not shown) of the second ferroelectric capacitor. As shown in FIG. 14e, a photoresist layer is coated on an entire surface of the substrate inclusive of the first ferroelectric layer 128 and the second ferroelectric layer, and the first insulating layer 126 is etched by photo etching to form a contact hole 129 exposing an upper surface of the first gate electrode 123 and a contact hole (not shown) exposing an upper surface of the second gate electrode (not shown).

Figure 14F:
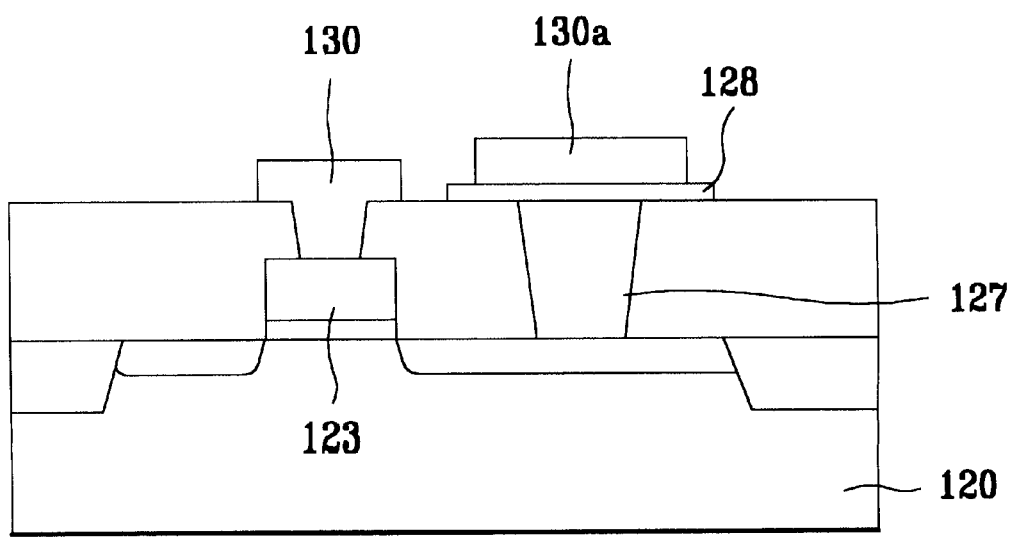

As shown in FIG. 14f, a first metal line 130 and a second metal line 130a are respectively coupled to the first gate electrode 123 and the second gate electrode through the contact holes. The first metal line 130 and the second metal line 130a are preferably formed extending in the same direction by fixed intervals. The metal line 130 is coupled to the first gate electrode 123 and used as the second electrode (an upper electrode) of the second ferroelectric capacitor. The second metal line 130a is coupled to the second gate electrode 123a and used as the second electrode of the first ferroelectric capacitor. As FIG. 14f shows only one unit cell and there are only one first gate electrode and second gate electrode shown, there are a plurality of first gate electrodes and a plurality of second gate electrodes in an actual cell array in a memory array of a semiconductor memory device. Accordingly, the first metal line 130 serves as a first split wordline SWL1 electrically coupling the first gate electrode 123 to other first gate electrodes disposed on the same line in a row direction, and the second metal line 130a also serves as a second split wordline SWL2 electrically coupling the second gate electrode to other second gate electrodes on the same line in the row direction. The first and second metal lines 130 and 130a are formed in a direction crossing the active regions.

Figure 14G:
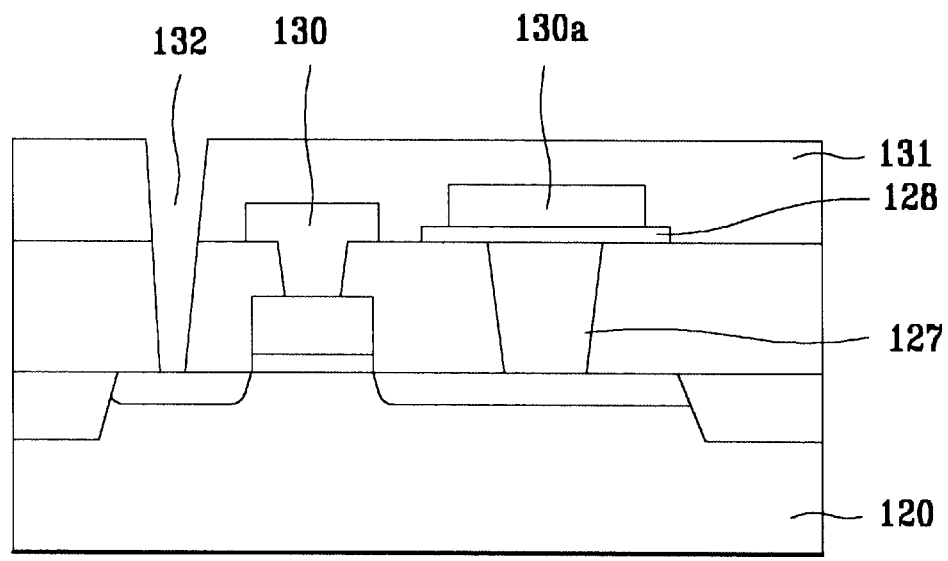

As shown in FIG. 14g, a second insulating layer 131 is formed on an entire surface inclusive of the first and second metal lines 130 and 130a, and has an upper surface thereof planarized by CMP or etch back. Then, the second insulating layer 131 and the first insulating layer 126 are selectively etched until the first drain region 125 adjacent the first gate electrode 123 and the second drain region (not shown) adjacent the second gate electrode (not shown) are exposed, which respectively forms a first bitline contact 132 and a second bitline contact (not shown).

Figure 14H:
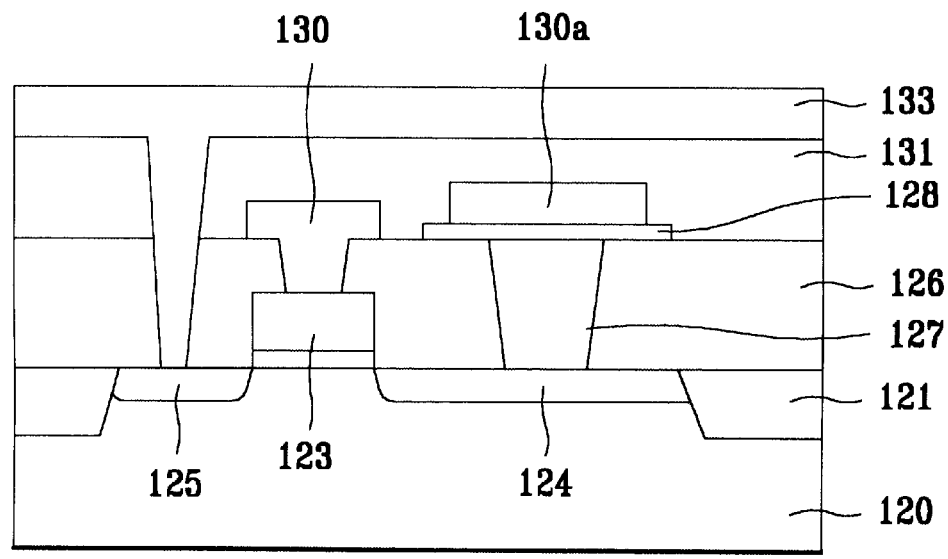

As shown in FIG. 14h, a first bitline 133 is electrically coupled to the first drain region 125 through the first bitline contact 132 and formed in a direction crossing the first metal line 130. Upon formation of a second bitline 133a (not shown) electrically coupled to the second drain region (not shown) through the second bitline contact (not shown), the method for fabricating the nonvolatile ferroelectric memory in accordance with the second preferred embodiment of the present invention is completed.

Figure 15:
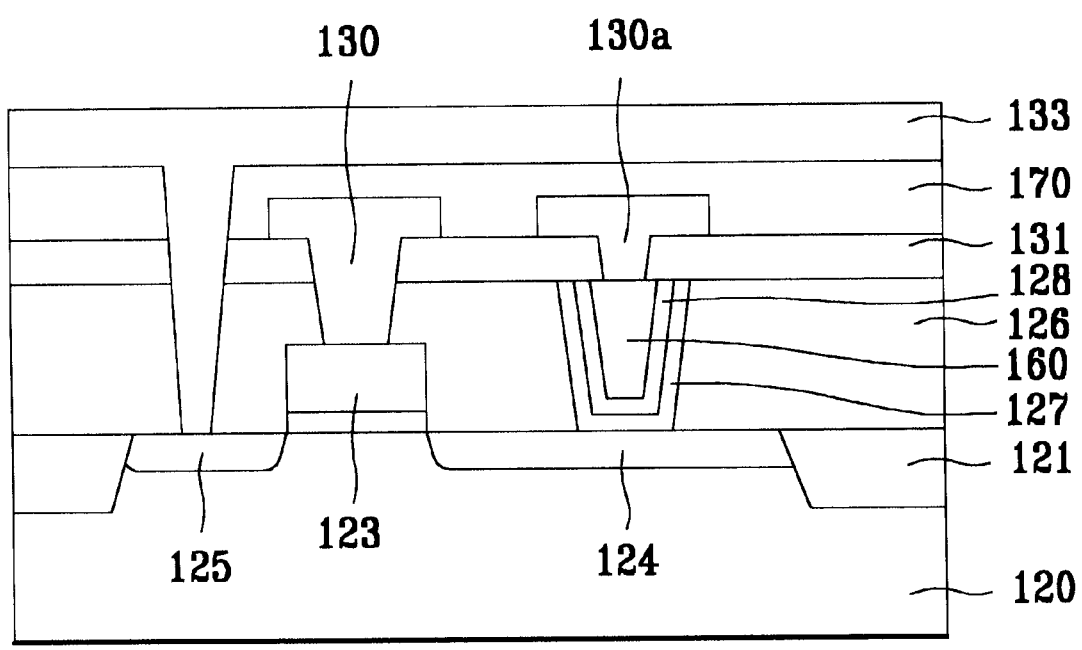
FIG. 15 is a diagram that illustrates a cross-section of a nonvolatile ferroelectric memory in accordance with yet another third preferred embodiment of the present invention.

A nonvolatile ferroelectric memory and a method for fabricating the same in accordance with a third preferred embodiment of the present invention will now be described. FIG. 15 is a diagram that illustrates a cross-section of a nonvolatile ferroelectric memory in accordance with the third preferred embodiment of the present invention.

As shown in FIG. 15, the nonvolatile ferroelectric memory in accordance with the third preferred embodiment includes a semiconductor substrate 120 having a first active region and a field region, a first gate electrode 123 on the active region of the substrate, a first source region 124 and a first drain region 125 on both sides of the first gate electrode 123, and a first insulating layer 126 having a first contact hole exposing the first gate electrode 123 and a second contact hole exposing the first source region 124. A first electrode 127 of the first ferroelectric capacitor is on an inside surface of the second contact hole. A ferroelectric layer 128 for use as the first ferroelectric capacitor is on the first electrode, and a second electrode of the first ferroelectric capacitor is on the ferroelectric layer 128. A metal line 130 is coupled to the first gate electrode 123 through the first contact hole, and a second metal line 130a is electrically coupled to the second gate electrode (not shown). A first bitline 133 electrically coupled to the first drain region 125. Though not shown in FIG. 15, there is a second active region separate from the first active region, on which the second gate electrode is formed. A first electrode of the second ferroelectric capacitor is coupled to the second source region of the second gate electrode, and a ferroelectric layer for use as a second ferroelectric capacitor is on the first electrode. A second bitline is coupled to the second drain region of the second gate electrode. Therefore, the first metal line 130 electrically couples the first gate electrode 123 and second electrode of the second ferroelectric capacitor, and the second metal line 130a electrically couples the second gate electrode and second electrode of the first ferroelectric capacitor. The first metal line 130 preferably serves as the first split wordline SWL1, and the second metal line 130a preferably serves as the second split wordline SWL2.

FIG. 15 is a layout for one unit cell, and although there is only one first gate electrode and second gate electrode shown in FIG. 15, there are a plurality of first gate electrodes and a plurality of second gate electrodes in an actual cell array. Accordingly, the first metal line 130 serves as a first split wordline SWL1 electrically coupling the first gate electrode 123 to other first gate electrodes disposed on the same line in a row direction, and the second metal line 130a also serves as a second split wordline SWL2 electrically coupling the second gate electrode to other second gate electrodes on the same line in the row direction. Additional peripheral circuits to perform read and write data operations (not shown) are coupled with an array of unit cells as shown in FIG. 15.

A preferred embodiment of a method for fabricating the nonvolatile ferroelectric memory in accordance with a third preferred embodiment of the present invention will now be described. FIGS. 16a~16g are diagrams that illustrate layouts showing processes of a method for fabricating a nonvolatile ferroelectric memory in accordance with the third preferred embodiment. FIGS. 17a~17g are diagrams that respectively illustrate cross-sections along lines I–I' in FIGS. 16a~16g. The third preferred embodiment according to the present invention forms a second electrode (e.g., an upper electrode) of a ferroelectric capacitor and the split wordline (e.g., first and second metal lines), separately and can use different processes. In contrast, the first and second preferred embodiments according to the present invention concurrently form the second electrode of the ferroelectric capacitor and the split wordline of identical material.

Figure 16A:
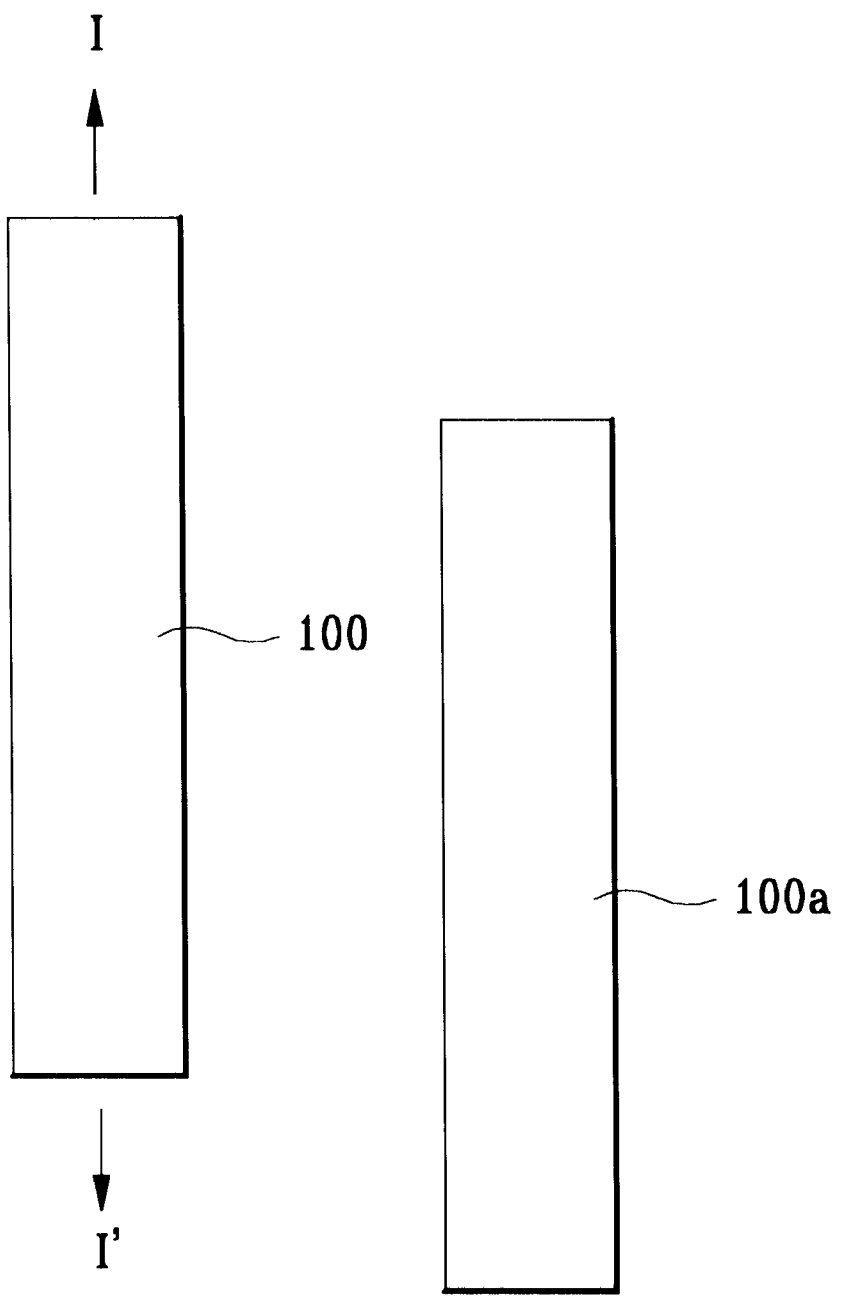
FIGS. 16a–16g are diagrams that illustrate layouts showing a method for fabricating a nonvolatile ferroelectric memory in accordance with yet another preferred embodiment of the present invention.
Figure 16B:
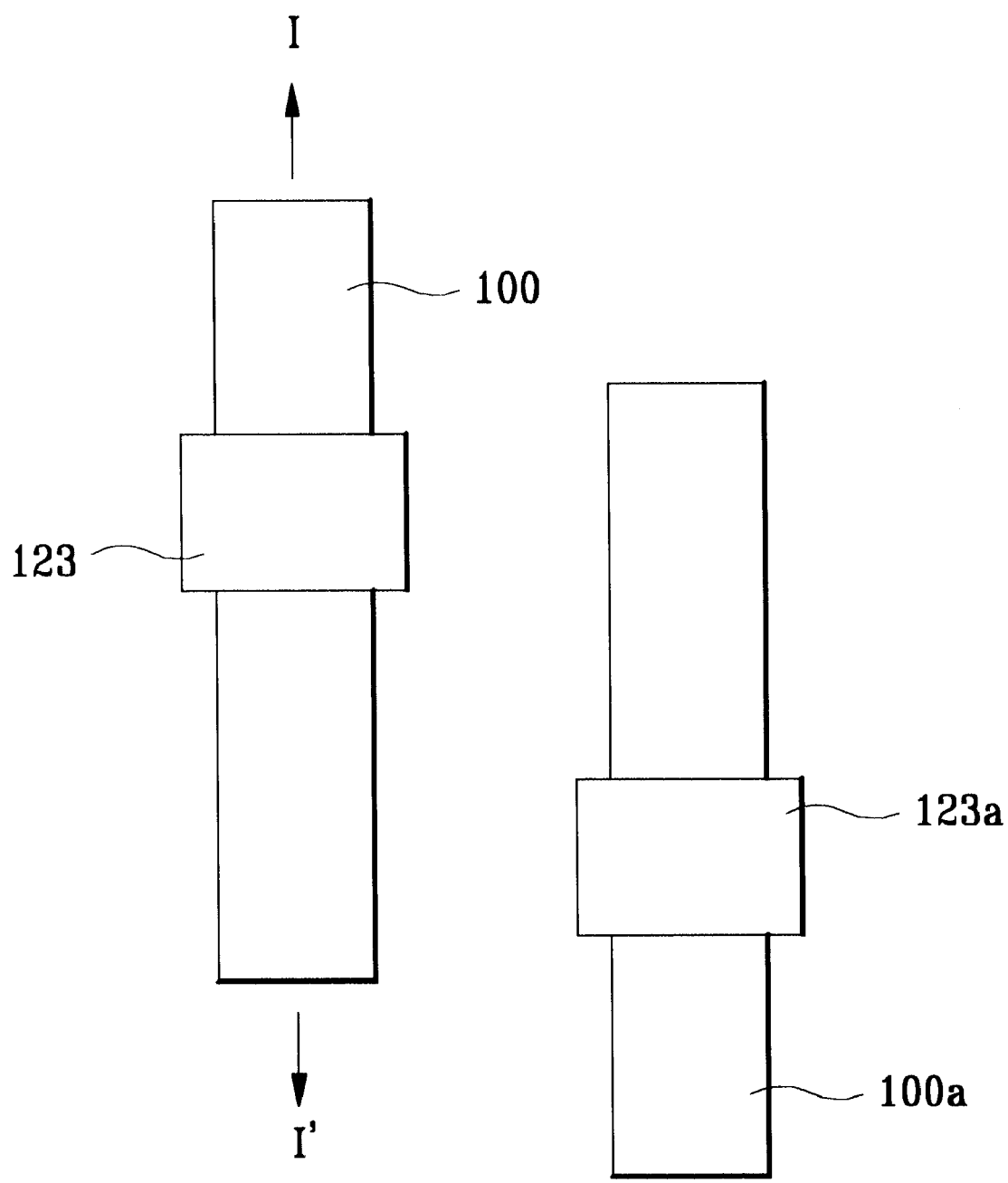
Figure 16C:
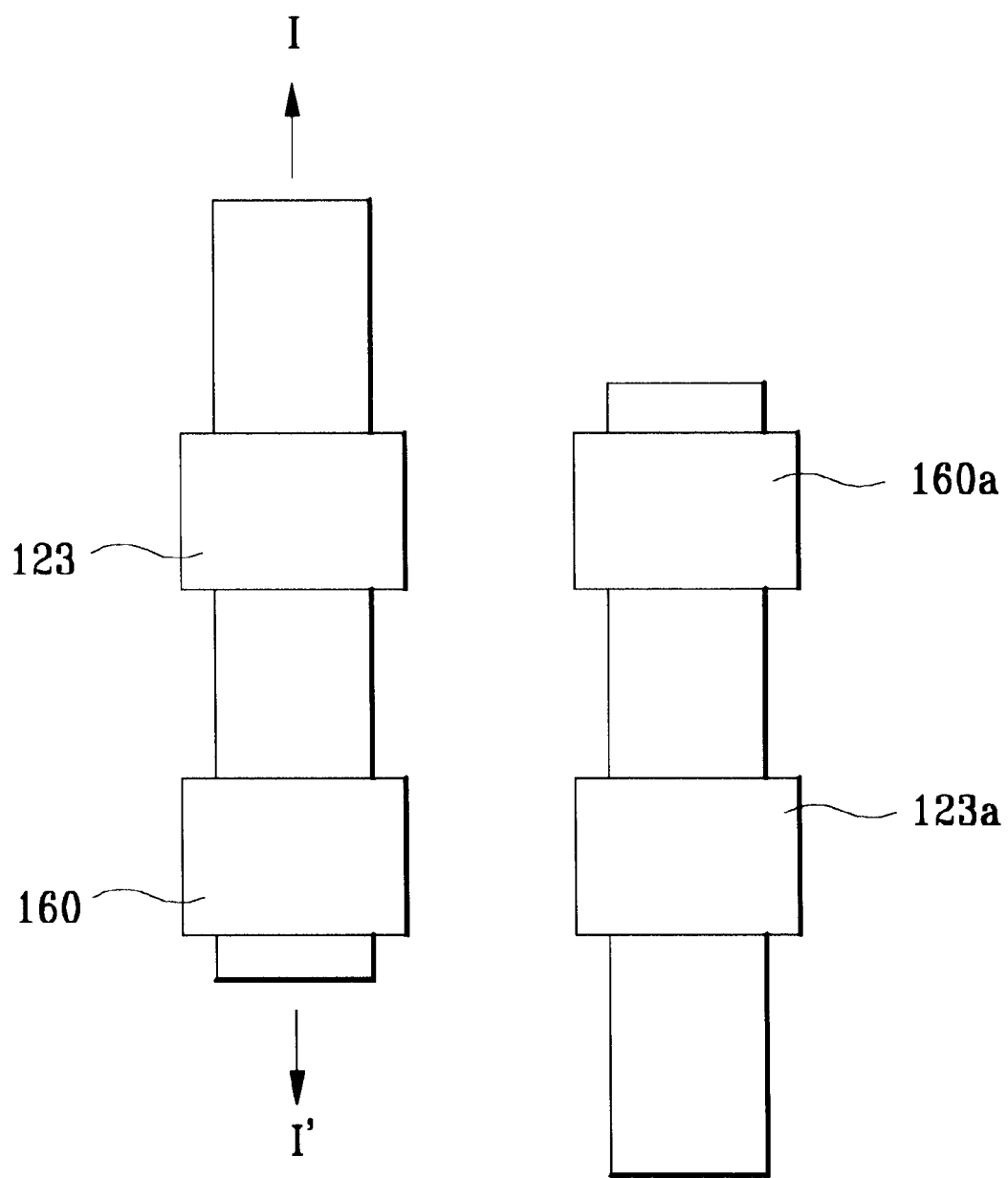

As shown in FIG. 16a, the third preferred embodiment of a nonvolatile ferroelectric memory includes asymmetric, but parallel active regions 100 and 100a on a first conduction type semiconductor substrate at fixed intervals. A region other than the active regions is a field region (e.g., device isolation layer), which is preferably formed by trench isolation. As shown in FIG. 16b, a gate electrode material is deposited on an entire surface of the substrate inclusive of the active regions 100 and 100a and field region, and patterned to respectively form a first gate electrode 123 and a second gate electrode 123a of the first transistor T1 and the second transistor T2. Then, though not shown, impurity ions of a conduction type opposite to the substrate are implanted in the substrate on both sides of the first gate electrode 123 to form first source/drain regions (not shown), and second source/drain regions in the substrate on both sides of the second gate electrode T2 (not shown). Then, a first insulating layer (not shown) is formed on an entire surface inclusive of the first and second gate electrodes 123 and 123a, and etched to form contact holes exposing the first source region and the second source region. As shown in FIG. 16c, a first conductive layer to be used as the first electrode (e.g., a lower electrode) of ferroelectric capacitors is preferably formed on an entire surface inclusive of the second insulating layer, and a ferroelectric layer and a second conductive layer to be used as a ferroelectric capacitor (e.g., an upper electrode) are formed in succession on the first conductive layer. The first conductive layer, the ferroelectric layer, and thee second conductive layer are preferably formed by CVD or sputtering. Then, CMP or etch back is conducted to remove the second conductive layer, the ferroelectric layer, and the first conductive layer until the first insulating layer is exposed, which forms first and second ferroelectric capacitors FC1, FC2. The first ferroelectric capacitor FC1 has a first electrode 127 of the first ferroelectric capacitor, the first ferroelectric layer 128 and the second electrode 160. A second ferroelectric capacitor FC2 has the first electrode 127a of the second ferroelectric capacitor, the second ferroelectric layer 128a, and the second electrode 160a of the second ferroelectric capacitor. In the capacitors, only the first conductive layer may be formed, or a barrier layer may additionally be formed under the first conductive layer, using for example, a first electrode material of the ferroelectric a capacitor. The first conductive layer may be formed of Pt, Ir, or Ru, and the barrier metal layer may be formed of TiN, $RuO_2$, $IrO_2$, or $PtSi_2$.

Figure 16D:
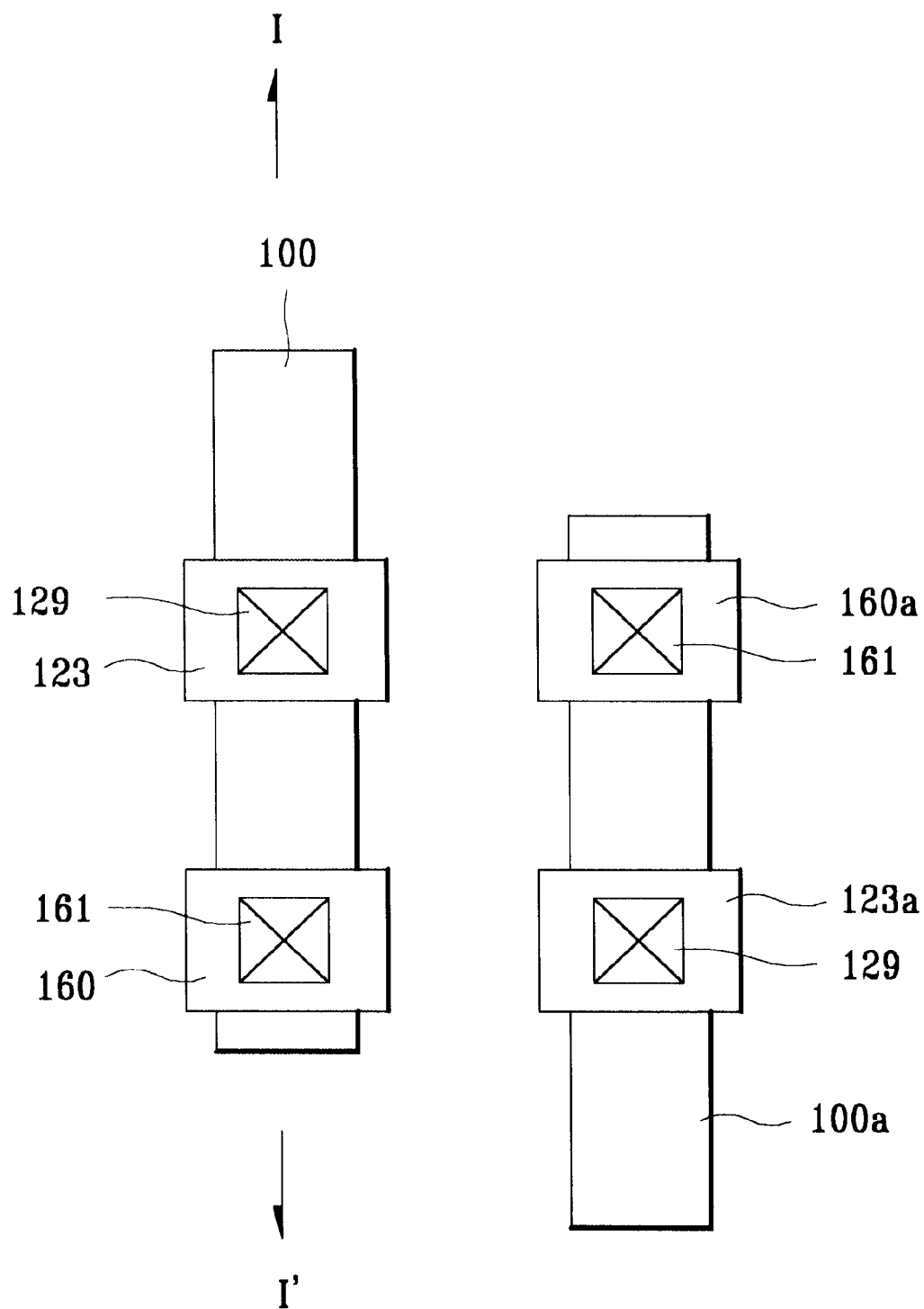

As shown in FIG. 16d, a second insulating layer (not shown) is formed on an entire surface inclusive of the first ferroelectric capacitor FC1 and the second ferroelectric capacitor FC2, and selectively etched until the first gate electrode 123 and the second gate electrode 123a are exposed to form first contact holes 129, and the second insulating layer can be etched until the second electrodes 160 and 160a of the first and second ferroelectric capacitors are exposed to form the second contact holes 161.

Figure 16E:
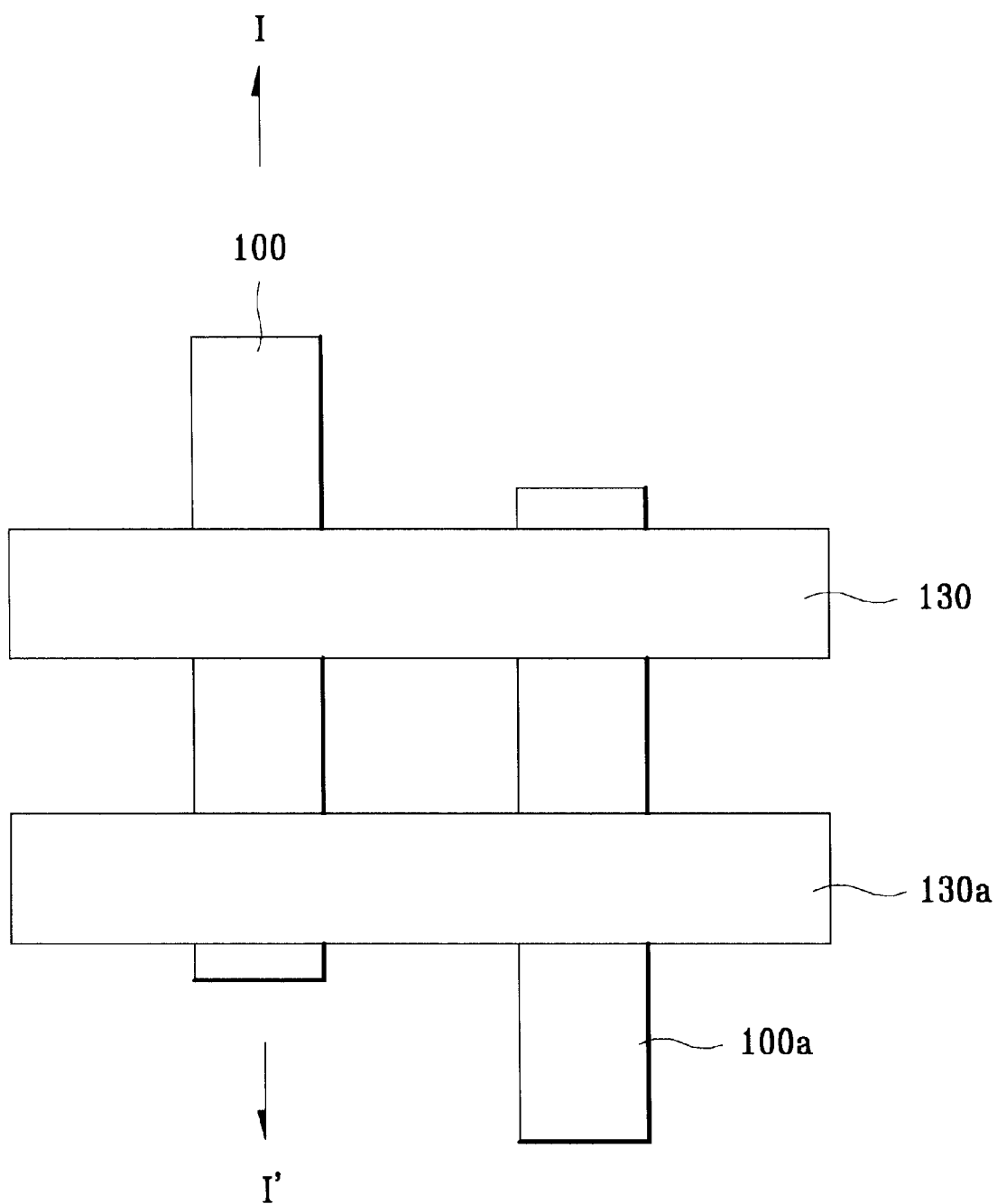

As shown in FIG. 16e, a first metal line 130 and a second metal line 130a are formed, which are electrically coupled to the first and second gate electrodes through the contact holes and the second electrodes of the first and second ferroelectric capacitors. That is, the first metal line 130 electrically couples the first gate electrode 123 and the second electrode 160a of the second ferroelectric capacitor, and the second metal line 130a electrically connects the second gate electrode 123a and the second electrode 160 of the first ferroelectric capacitor. As FIG. 16e shows only one unit cell, there are only one first gate electrode and second gate electrode shown. However, the present invention is not intended to be so limited, because there are a plurality of first gate electrodes and a plurality of second gate electrodes (not shown) in an actual cell array. Accordingly, the first metal line 130 serves as a first split wordline SWL1 electrically coupling the first gate electrode 123 to other first gate electrodes disposed on the same line in a row direction, and the second metal line 130a also serves as a second split wordline SWL2 electrically coupling the second gate electrode to other second gate electrodes on the same line in the row direction. The first and second metal lines 130 and 130a are formed in a direction crossing the active regions.

Figure 16F:
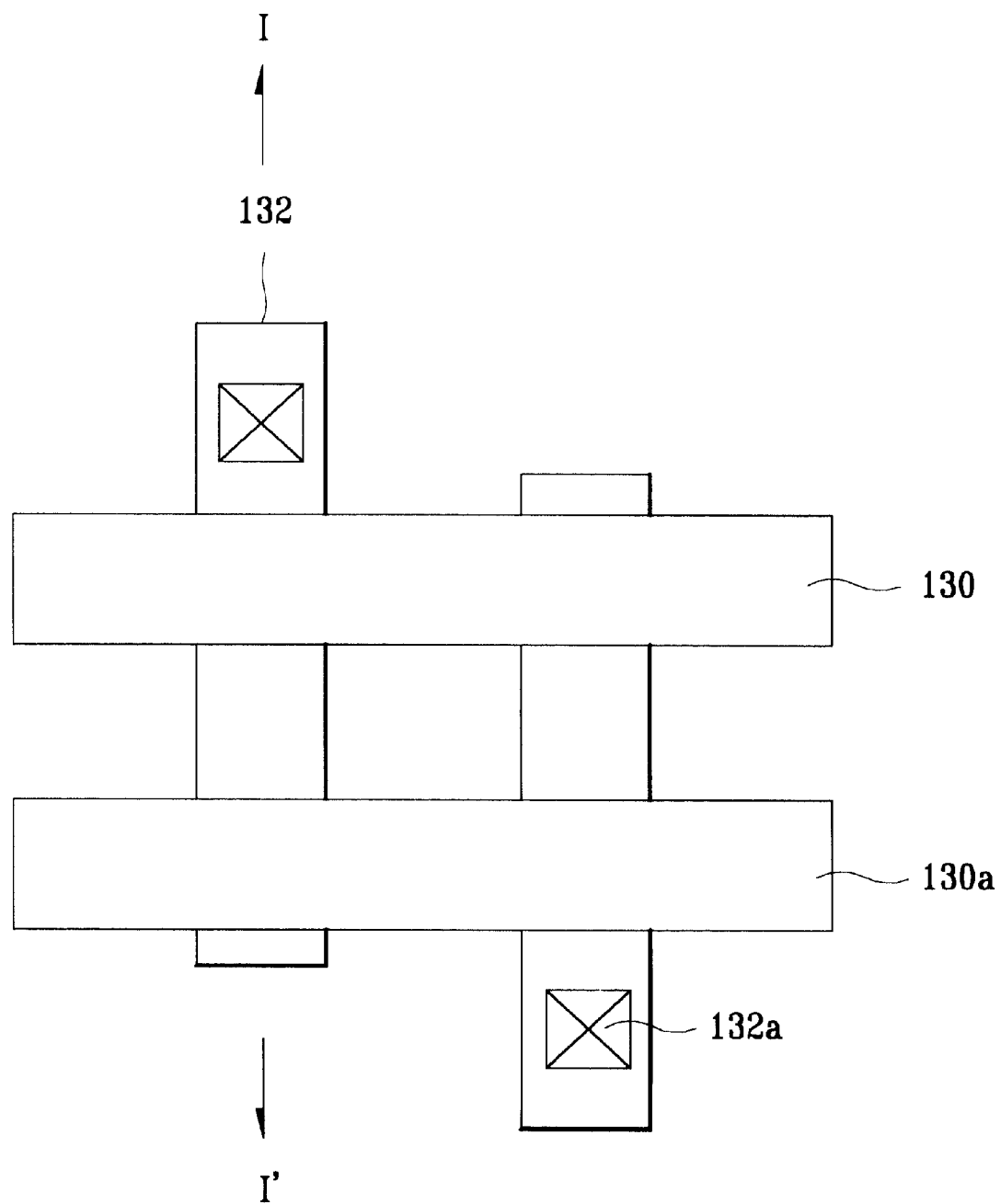

As shown in FIG. 16f, a third insulating layer (not shown) is formed on an entire surface inclusive of the first and second metal lines 130 and 130a, and an upper surface thereof is planarized. The third insulating layer, the second insulating layer, and the first insulating layer are etched in succession until the impurity region (e.g., the first drain region) on one side of the first gate electrode 123 is exposed by a first bitline contact 132, and the impurity region (e.g., the second drain region) on one side of the second gate electrode is exposed by a second bitline contact 132a.

Figure 16G:
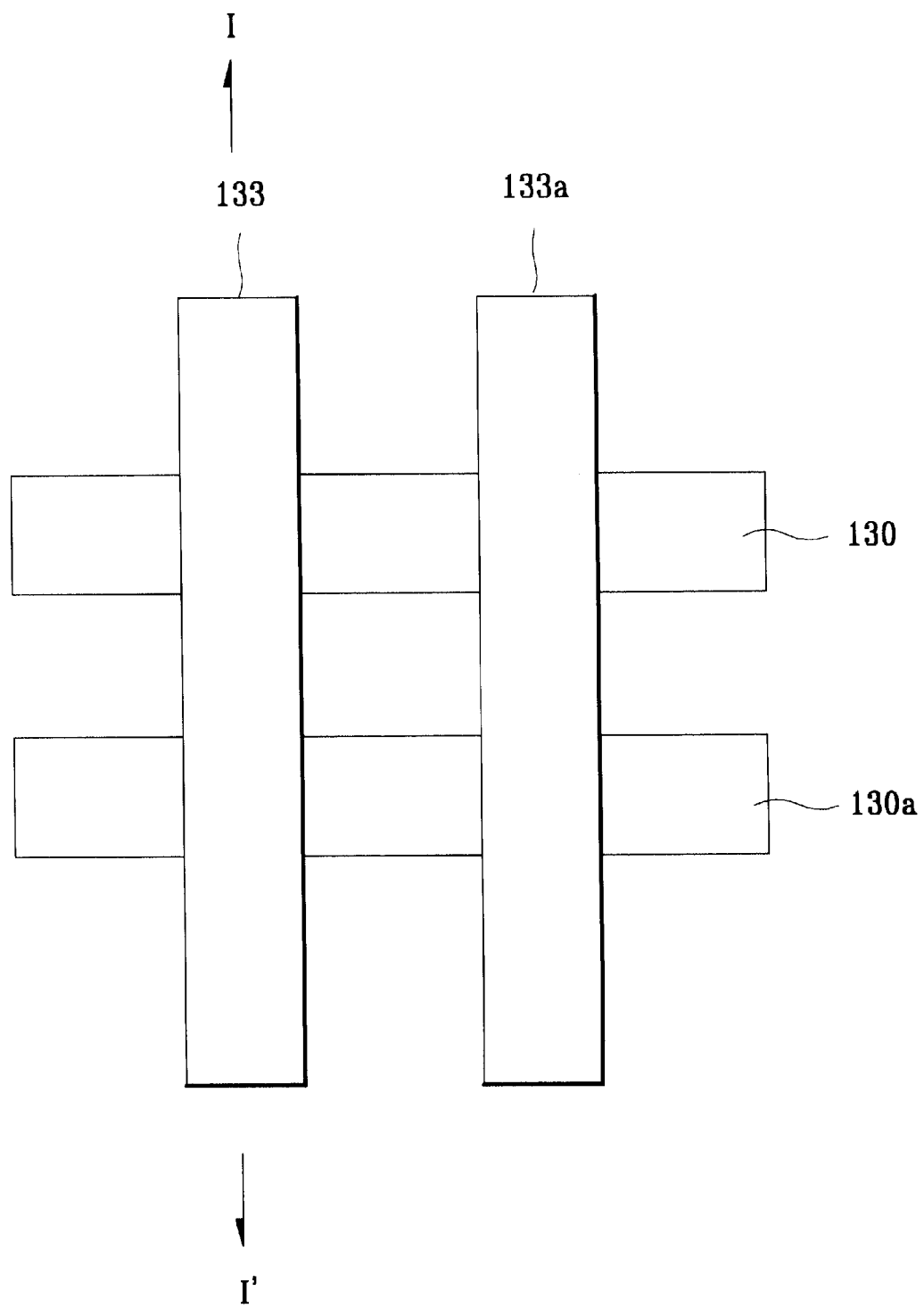

As shown in FIG. 16g, upon formation of a first bitline 133 electrically coupled to the first drain region through the first bitline contact 132 and formation of second bitline 133a electrically coupled to the second drain region through the second bitline contact 132a, the method for fabricating a nonvolatile ferroelectric memory in accordance with third embodiment of the present invention is completed.

Figure 17A:
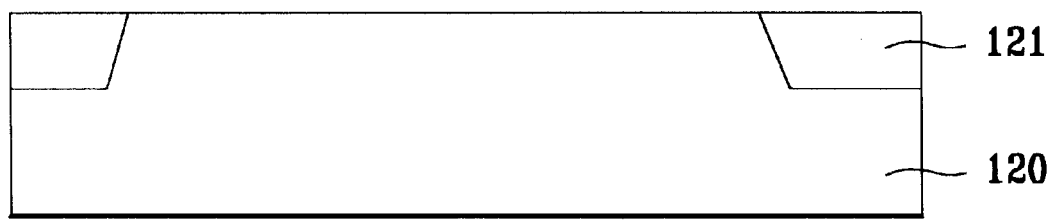
FIGS. 17a–17g are diagrams that respectively illustrate cross-sections along lines I–I' of FIGS. 16a–16g.
Figure 17B:
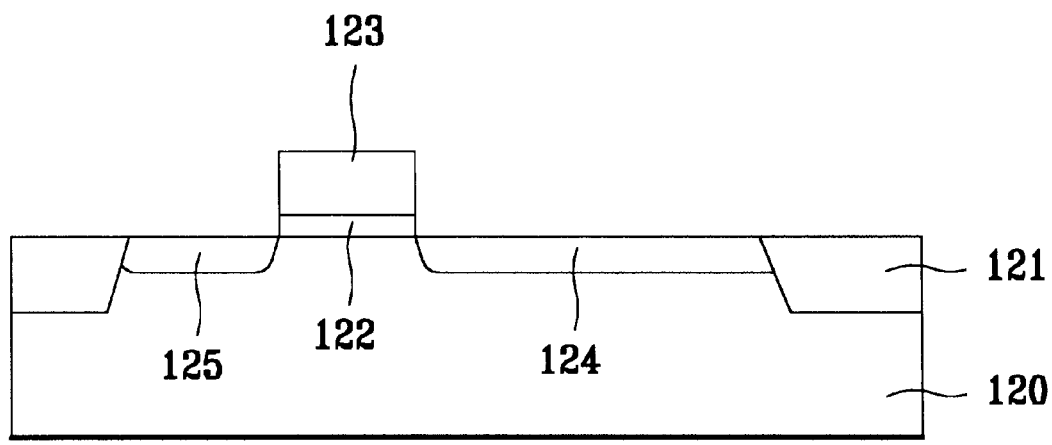

FIGS. 17a~17g are diagrams that respectively illustrate cross-sections along lines I–I' in FIGS. 16a~16g. As shown in FIG. 17a, the preferred embodiment of a method of fabricating a nonvolatile ferroelectric memory according to the third preferred embodiment begins by providing a semiconductor substrate 120 having an active region and a field region 121. The field region is preferably formed by trench isolation. As shown in FIG. 17b, a first gate electrode 123 and a second gate electrode 123a (not shown) are formed on an active region and a field region of a substrate 120, with a gate insulating film 122 disposed inbetween. Then, the first gate electrode 123 and the second gate electrode are used as masks in implanting impurity ions to respectively form first source/drain regions 124 and 125 and second source/drain regions 124a and 125a (not shown) in the substrate on both sides of the first gate electrode 123 and the second gate electrode.

Figure 17C:
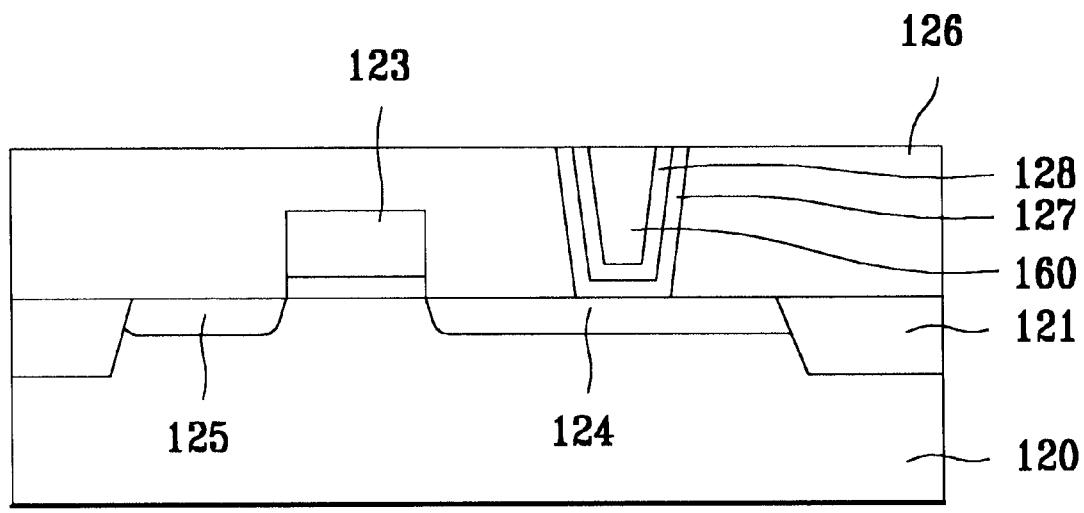
Figure 17D:
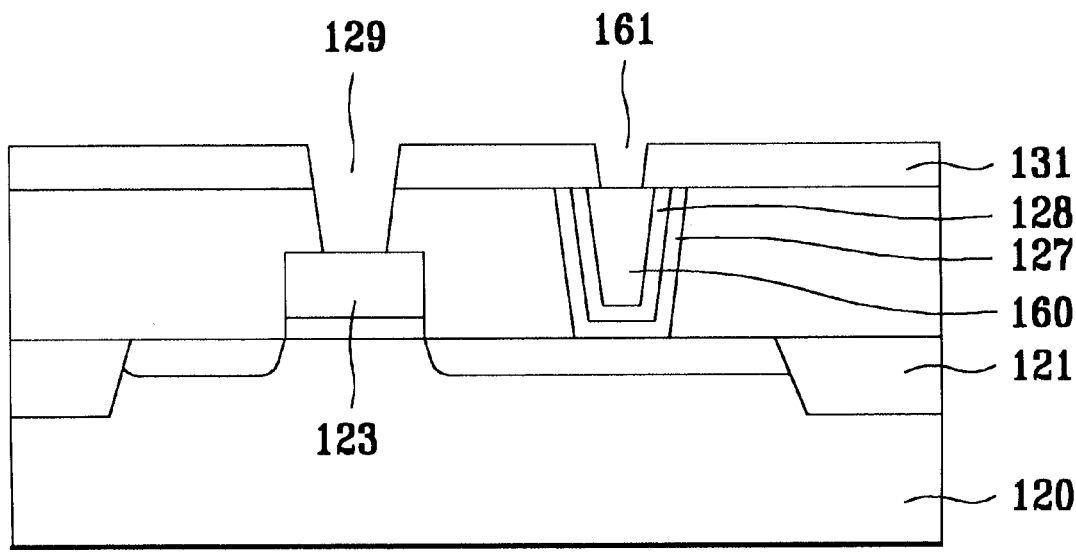

As shown in FIG. 17c, a first insulating layer 126 is formed on an entire surface inclusive of the first gate electrode 123 and the second gate electrode. The first insulating layer 126 is preferably an ILD layer. Then, the first insulating layer 126 is planarized by CMP, and removed until the first source region 124 and the second source region are exposed, to form contact holes. A first conductive layer is formed on an entire surface inclusive of the first insulating layer 126 for use as a first electrode (e.g., a lower electrode) of a ferroelectric capacitor, and a ferroelectric layer and a second conductive layer for use as a second electrode of the ferroelectric-capacitor (e.g., an upper electrode) are formed on the first conductive layer in secession. The first conductive layer, the ferroelectric layer, and the second conductive layer are preferably formed by CVD or sputtering, respectively. Then, CMP or etch back is conducted to remove the second conductive layer, the ferroelectric layer, and the first conductive layer until the first insulating layer 126 is exposed, to form ferroelectric capacitors in the contact holes. A first ferroelectric capacitor FC1 has the first electrode 127, the first ferroelectric layer 128 and the second electrode 160. A second ferroelectric capacitor FC2 (not shown) has the first electrode 127a, the second ferroelectric layer 128a, and the second electrode 160a (not shown). In this instance, only the first conductive layer may be formed, or a barrier layer may be additionally formed under the first conductive layer using a suitable material. The first conductive layer may be formed of Pt, Ir, or Ru, and the barrier metal layer may be formed of TiN, $RuO_2$, $IrO_2$, or $PtSi_2$. However, the present invention is not intended to be so limited. As shown in FIG. 17d, a second insulating layer 131 is formed on an entire surface of the substrate inclusive of the first ferroelectric capacitor FC1 and the second ferroelectric capacitor FC2, and selectively etched until the first gate electrode 123 and the second gate electrode (not shown) are exposed by first contact holes 129, and until the second electrodes 127 of the first ferroelectric capacitors and the second electrodes (not shown) of the second ferroelectric capacitors are exposed by second contact holes 161, respectively. In FIG. 17d, the first contact holes exposing the second gate electrodes and the second contact holes exposing the second electrodes of the second ferroelectric capacitor are not shown.

Figure 17E:
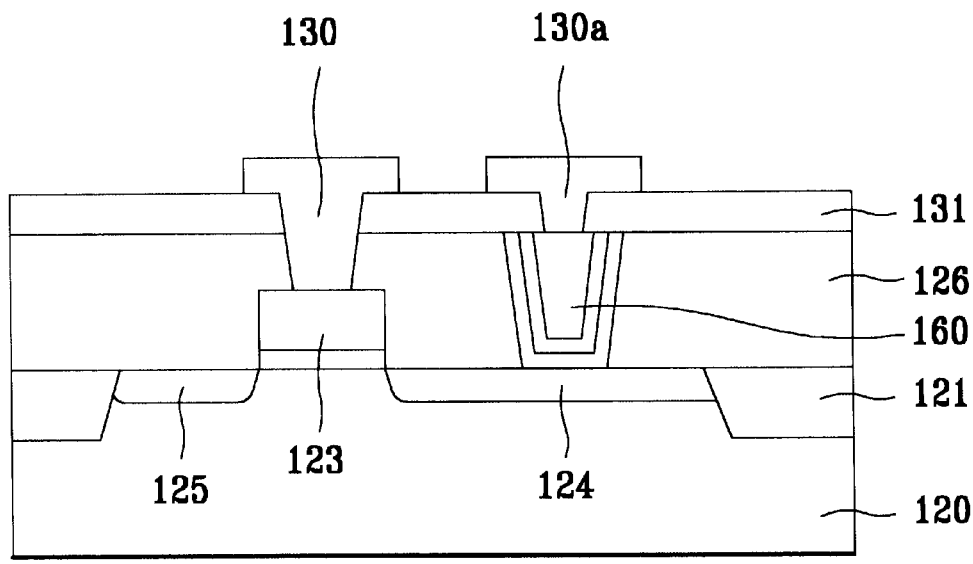

As shown in FIG. 17e, a first metal line 130 is formed, which is electrically coupled to the first gate electrode and the second electrode (not shown) of the second ferroelectric capacitor through the first and second contact holes, and a second metal line 130a is formed, which is electrically coupled to the second gate electrode and the second electrode 160 of the first ferroelectric capacitor. The first metal line 130 and the second metal line 130a are preferably formed in a direction perpendicular to the active region.

Figure 17F:
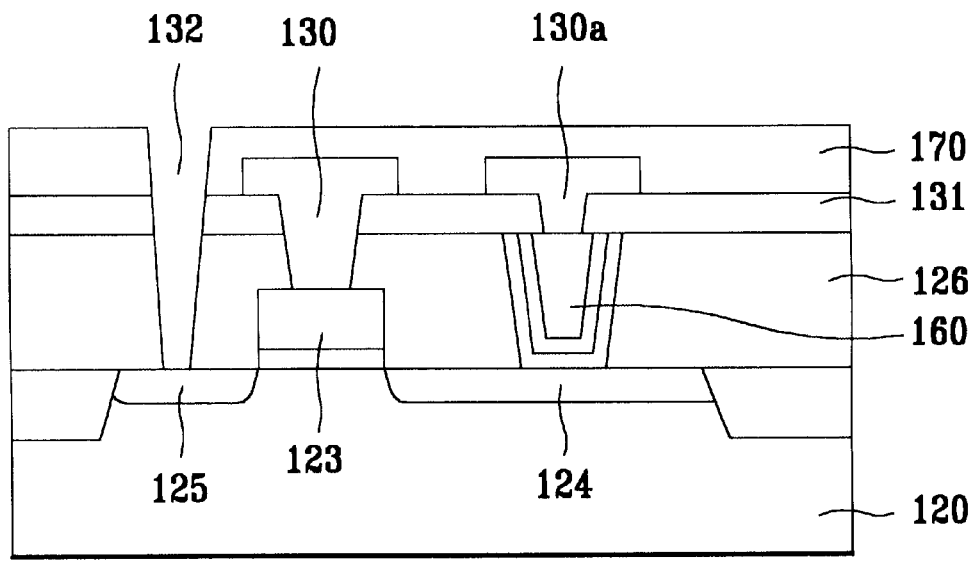
Figure 17G:
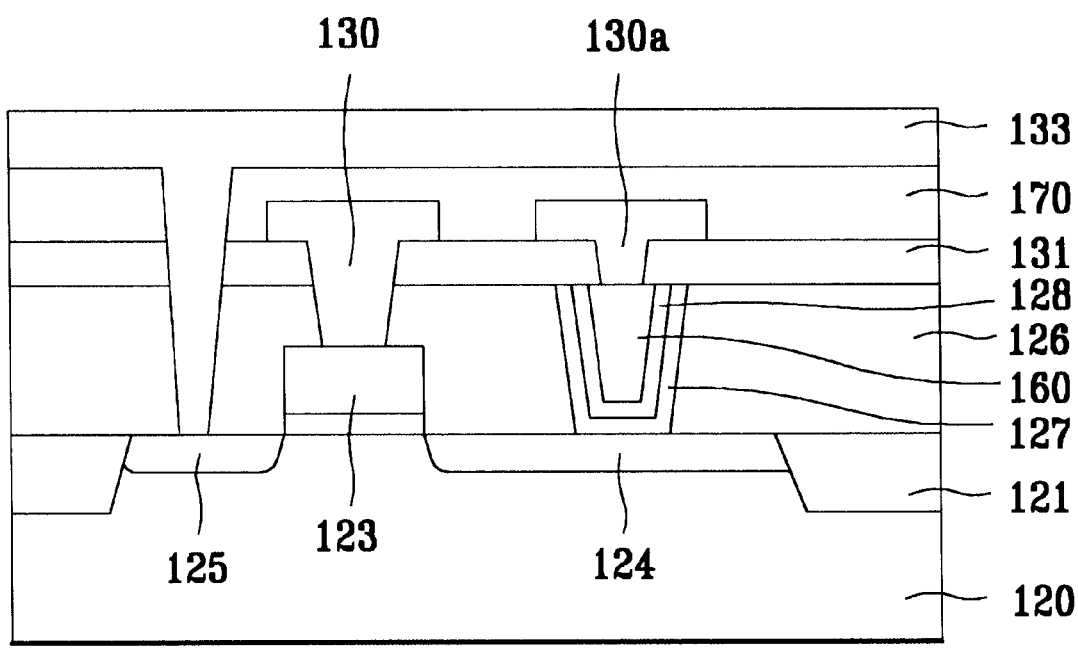

As shown in FIG. 17f, a third insulating layer 170 is formed on an entire surface inclusive of the first and second metal lines 130 and 130a, and the third insulating layer 170, the second insulating layer 131, and the first insulating layer 126 are selectively etched in succession until the impurity region (e.g., the first drain region) on one side of the first gate electrode 123 and the impurity region (e.g., the second drain region) on one side of the second gate electrode are exposed, to respectively form a first bitline contact 132 and a second bitline contact 132a (not shown). As shown in FIG. 17g, upon formation, a first bitline 133 is electrically coupled to the first drain region 125 on one side of the gate electrode 123 through the first bitline contact 132. Upon formation of a second bitline (not shown) that electrically coupled to the second drain region on one side of the second gate electrode through the second bitline contact, the method for fabricating the nonvolatile ferroelectric memory in accordance with the third preferred embodiment is completed.

Figure 18:
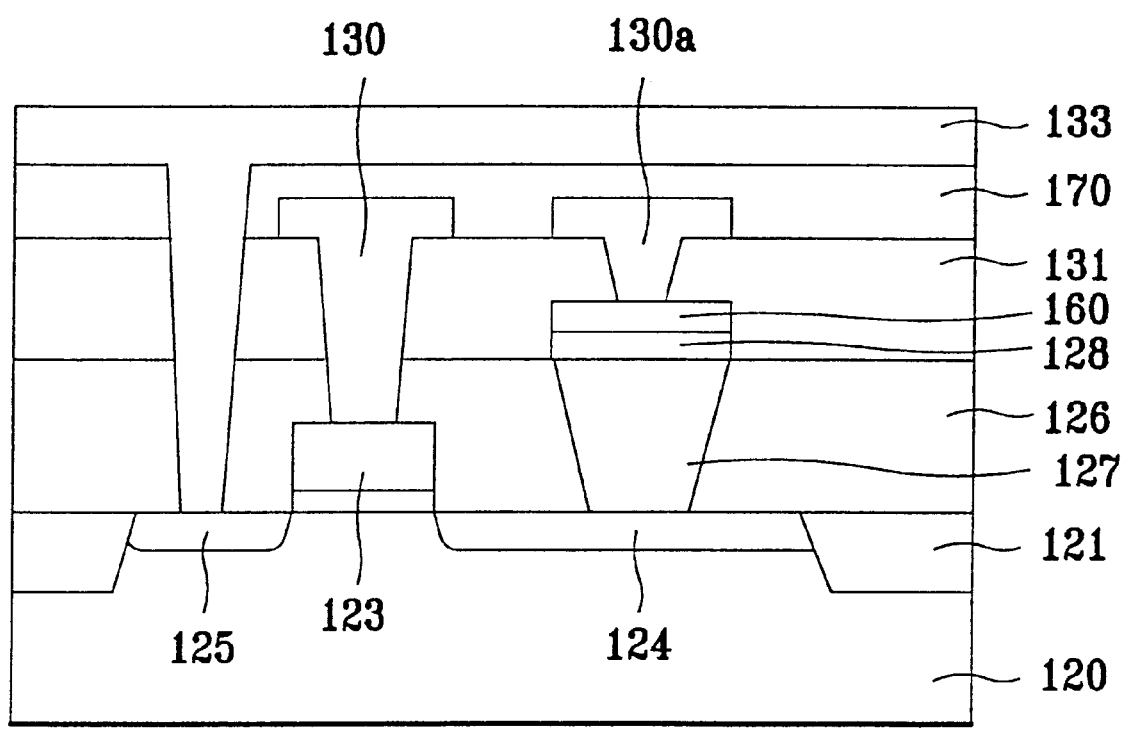
FIG. 18 is a diagram that illustrates a cross-section of a nonvolatile ferroelectric memory in accordance with still another preferred embodiment of the present invention.

A nonvolatile ferroelectric memory and a method for fabricating a nonvolatile ferroelectric memory in accordance with a fourth preferred embodiment of the present invention will now be described. FIG. 18 is a diagram that illustrates a cross-section of a nonvolatile ferroelectric memory in accordance with a fourth preferred embodiment of the present invention, and FIGS. 19a~19g are diagrams that illustrate cross-sections showing a preferred embodiment of a method for fabricating a nonvolatile ferroelectric memory in accordance with the fourth preferred embodiment.

As shown in FIG. 18, the nonvolatile ferroelectric memory in accordance with the fourth preferred embodiment of the present invention includes a semiconductor substrate 120 provided with first active regions and field regions, a first gate electrode 123 formed on the active region of the substrate, and a first source region 124 and a first drain region 125 formed on both sides of the first gate electrode 123. A first insulating layer 126 has a contact hole exposing the first source region 124, and a first electrode 127 of the first ferroelectric capacitor FC1 is formed in the contact hole. A ferroelectric layer 128 for use in the first ferroelectric capacitor is formed on the first electrode, and a second electrode 160 for use in the first ferroelectric capacitor is formed on the ferroelectric layer 128. A first metal line 130 is coupled to a second electrode of the second ferroelectric capacitor and coupled to the first gate electrode (e.g., through a contact hole). A second metal line 130a is electrically coupled to the second electrode 160 of the first ferroelectric capacitor and the second gate electrode 123a (not shown). A first bitline 133 is electrically coupled to the first drain region 125. Though not shown in FIG. 18, there is a second active region separate from the first active region, on which the second gate electrode is formed. A first electrode of the second ferroelectric capacitor is stuffed in another contact hole of the first insulating layer 126 to be coupled to the second source region on one side of the second gate electrode, and a ferroelectric layer for use in a second ferroelectric capacitor is formed on the first electrode. A second bitline is coupled to the second drain region on one side of the second gate electrode. Therefore, the first metal line 130 electrically couples the first gate electrode 123 and the second electrode of the second ferroelectric capacitor, and the second metal line 130a electrically couples the second gate electrode and the second electrode of the first ferroelectric capacitor. The first metal line 130 preferably serves as the first split wordline SWL1, and the second metal line 130a preferably serves as the second split wordline SWL2. Although layout for one unit cell is described above with reference to FIG. 18, there are a plurality of unit cells having first and second gate electrodes and a plurality of first and second capacitors in a cell array. Accordingly, the first metal line 130 serves as a first split wordline SWL1 electrically coupling the first gate electrode 123 to other first gate electrodes disposed on the same line in a row direction, and the second metal line 130a also serves as a second split wordline SWL2 electrically coupling the second gate electrode to other second gate electrodes on the same line in the row direction.

Figure 19A:
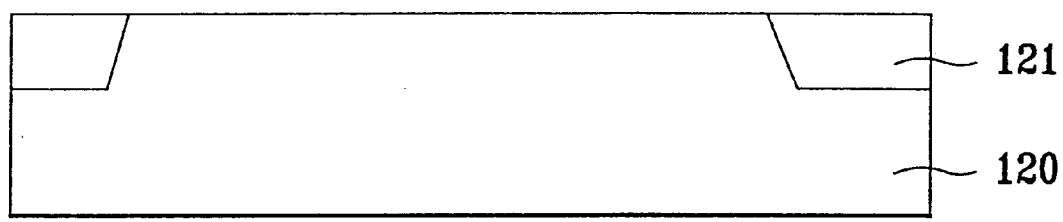
FIGS. 19a–19g are diagrams that illustrate cross-sections showing a method for fabricating a nonvolatile ferroelectric memory in accordance with still another preferred embodiment of the present invention.
Figure 19B:
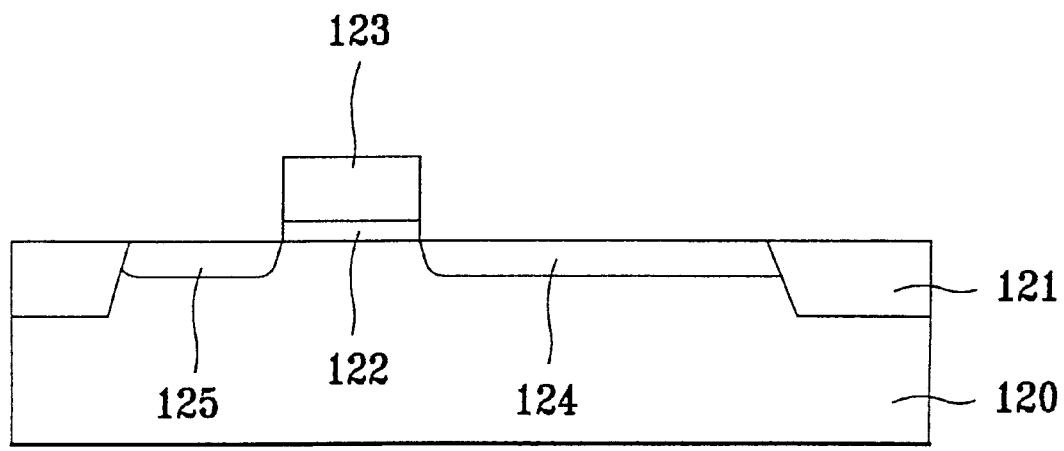

A preferred embodiment of a method for fabricating a nonvolatile ferroelectric memory in accordance with the fourth preferred embodiment of the present invention will now be described. As shown in FIG. 19a, a semiconductor substrate 120 is defined into an active region and a field region 121. The field region is preferably formed by trench isolation. As shown in FIG. 19b, a first gate electrode 123 and a second gate electrode (not shown) are formed on an active region and a field region of a substrate 120, with a gate insulating film 122 disposed inbetween. Then, the first gate electrode 123 and the second gate electrode are respectively used as masks in implanting impurity ions to form first source/drain regions 124 and 125 and second source/drain regions 124a and 125a (not shown) in the substrate on both sides of the first gate electrode 123 and the second gate electrode.

Figure 19C:
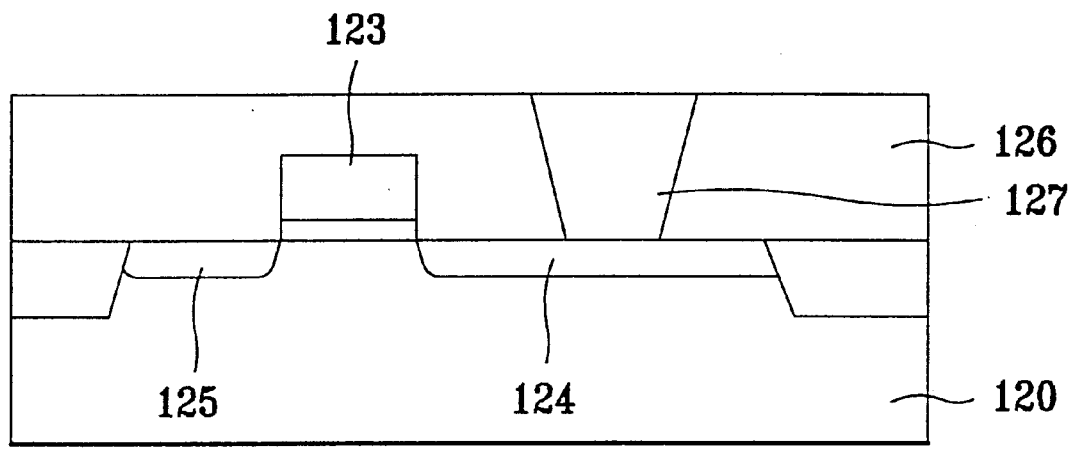

As shown in FIG. 19c, a first insulating layer 126 is formed on an entire surface inclusive of the first gate electrode 123 and the second gate electrode. The first insulating layer 126 is preferably an ILD layer. Then, the first insulating layer 126 is planarized by CMP, and selectively removed to form contact holes until the first source region 124 and the second source region are exposed. A first conductive layer is formed on an entire surface inclusive of the first insulating layer 126 for use as a first electrode of the ferroelectric capacitor by sol-gel process, and planarized by CMP or etch back, to form a first electrode 127 of the first ferroelectric capacitor and a first electrode 127a (not shown) of the second ferroelectric capacitor. In the sol-gel process, the first conductive layer is preferably deposited in a solid state by a solid state deposition, and altered into a gel state such that the first conductive layer is fully stuffed in the contact hole. However, the formation of the first conductive layer by CVD or sputtering is preferably the same as the first preferred embodiment that forms the conductive layer, not stuffed in the contact hole, but along an inside surface of the contact hole. Further, a barrier metal layer may be formed before the first conductive layer is formed. The first conductive layer is formed of Pt, Ir, Ru, and the barrier metal layer is formed of TiN, $RuO_2$, $IrO_2$, or $PtSi_2$. When the first conductive layer is formed after the barrier metal layer is formed, the barrier metal layer is formed by CVD or sputtering, and the first conductive layer is formed by sol-gel.

Figure 19D:
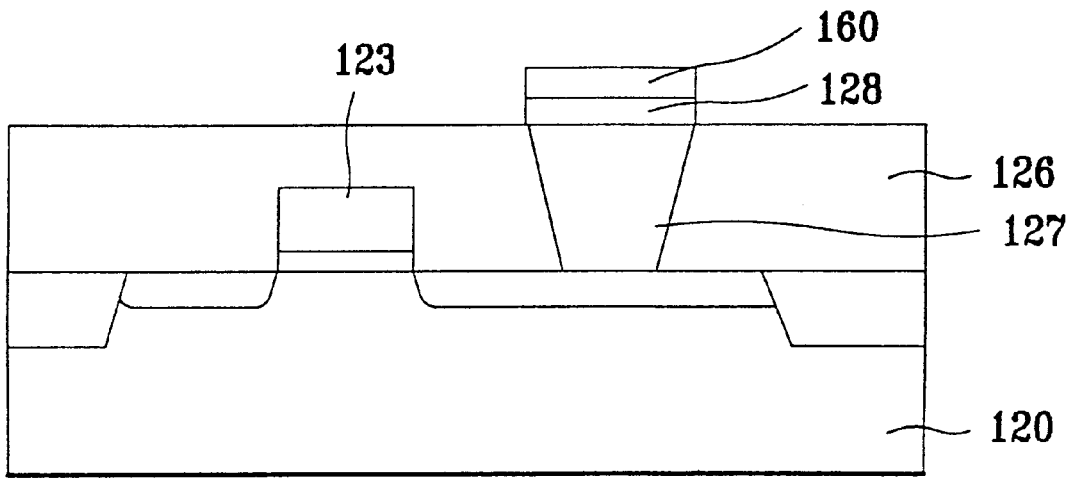

As shown in FIG. 19d, a ferroelectric layer and a second conductive layer for use as a second electrode of the ferroelectric capacitor are formed on an entire surface inclusive of the first electrode 127 of the first ferroelectric capacitor and a first electrode of the second ferroelectric capacitor in succession, and patterned by photo etching to leave the second conductive layer and the ferroelectric material layer on the first electrodes. Accordingly, the first ferroelectric layer 128 and the second electrode 160 of the first ferroelectric capacitor are formed on the first electrode 127 of the first ferroelectric capacitor, and the second ferroelectric layer 128a (not shown) and the second electrode 160a (not shown) of the second ferroelectric layer are formed on the first electrode 127a (not shown) of the second ferroelectric capacitor.

Figure 19E:
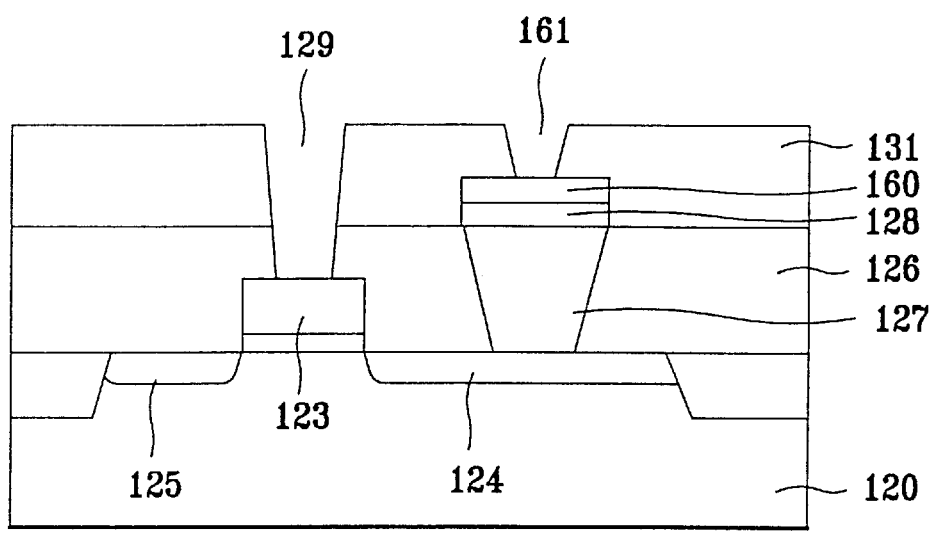
Figure 19F:
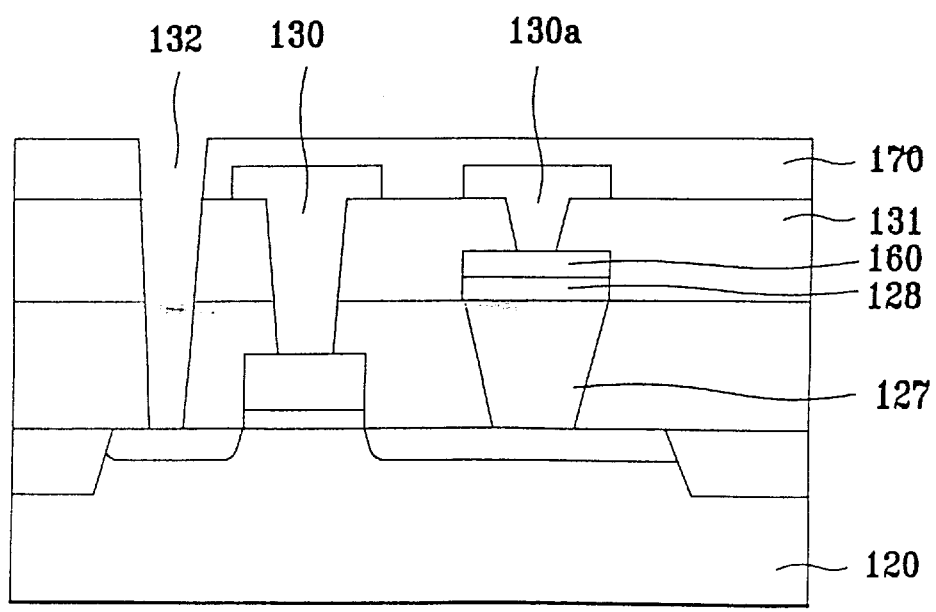

As shown in FIG. 19e, a second insulating layer 131 is formed on an entire surface of the substrate inclusive of the second electrodes of the ferroelectric capacitors, and selectively etched by photo etching to form first contact holes 129 exposing the first gate electrode 123 and the second gate electrode (not shown) and until the second contact holes 161 are formed exposing the second electrodes of the ferroelectric capacitors, respectively. As shown in FIG. 19f, a first metal line 130 is formed, which is electrically coupled to the first gate electrode 123 and the second electrode 160a of the second ferroelectric capacitor through the first and second contact holes 129 and 161. A second metal line 130a is formed, which is electrically coupled to the second gate electrode 123a and the second electrode 160 of the first ferroelectric capacitor, through the first and second contact holes 129 and 161. As FIG. 19f is a layout for one unit cell, there are a plurality of first gate electrodes and a plurality of second gate electrodes in an actual cell array. Accordingly, the first metal line 130 serves as a first split wordline SWL1 electrically coupling first gate electrodes disposed on the same line in a row direction, and the second metal line 130a also serves as a second split wordline SWL2 electrically coupling second gate electrodes disposed on the same line in the row direction. The first metal line 130 and the second metal line 130a are formed in a direction crossing the active region. Then, a third insulating layer 134 is formed on an entire surface of the substrate inclusive of the first and second metal lines 130 and 130a, and an upper surface thereof is planarized. Then, the third insulating layer 170, the second insulating layer 131, and the first insulating layer 126 are selectively etched until the first drain region 125 on one side of the first gate electrode 123 and the second drain region (not shown) on one side of the second gate electrode are exposed, which forms a first bitline contact 132 and a second bitline contact 132a (not shown), respectively.

Figure 19G:
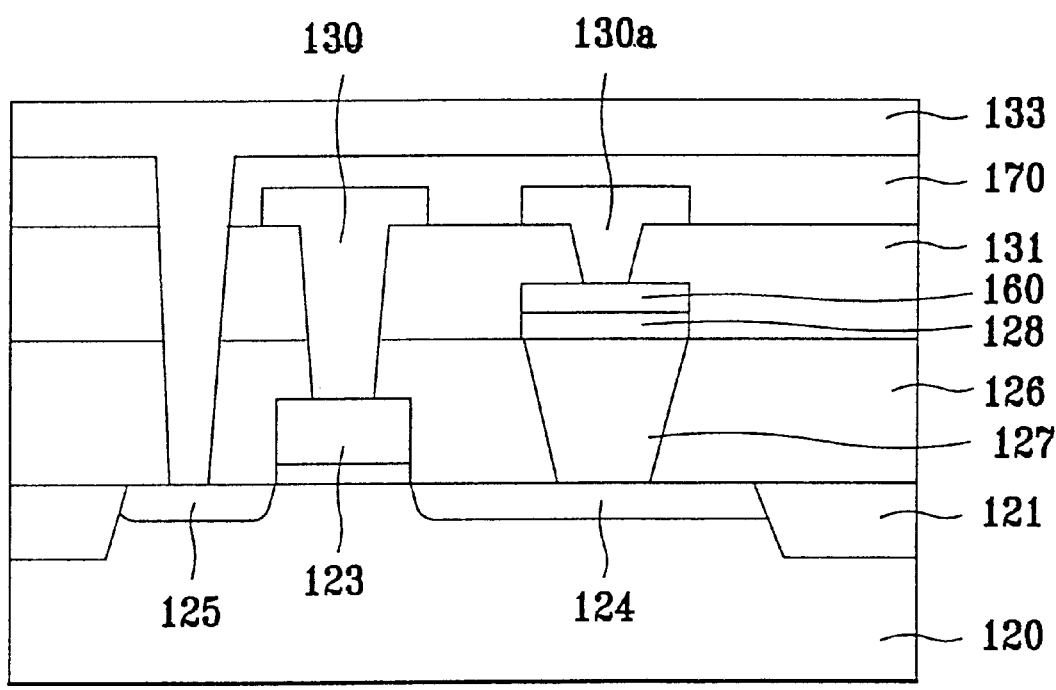

As shown in FIG. 19g, a first bitline 133 is formed in a direction crossing the first metal line 130 and electrically coupled to the first drain region 125 through the first bitline contact 132. Upon formation of a second bitline (not shown) electrically coupled to the second drain region (not shown) through the second bitline contact (not shown), the method for fabricating the nonvolatile ferroelectric memory in accordance with the fourth preferred embodiment is completed.

As described above, preferred embodiments of nonvolatile ferroelectric memories and methods for fabricating the same have various advantages. Direct connection of the first electrode (e.g., a lower electrode) of the ferroelectric capacitor to the substrate can reduce complexity of a fabrication step, improve fabrication process interchangeability with peripheral circuits, and can secure fabrication process allowances or tolerances. Further, a cell size can be reduced without deterioration, and a capacitor area can be increased or maximized. In addition, a number of fabrication steps of the cell can be reduced or minimized, to reduce a production cost, and to secure price competitiveness.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:
   a plurality of first gate electrodes and second gate electrodes formed on an active region of a substrate electrically separated from each other;
   a plurality of first ferroelectric capacitors each having a first electrode coupled to the substrate at one side of a corresponding one of the first gate electrodes, and a plurality of second ferroelectric capacitors each having a first electrode coupled to the substrate at one side of a corresponding one of the second gate electrodes; and
   a first metal line electrically coupling the plurality of first gate electrodes, and a second metal line electrically coupling the plurality of second gate electrodes.

2. The memory device of claim 1, wherein the first metal line is formed as a unit with the second electrodes of the second ferroelectric capacitors, and the second metal line is formed as a unit with the first electrodes of the first ferroelectric capacitors.

3. The memory device of claim 1, wherein the first metal line is a first split wordline and the second metal line is a second split wordline.

4. The memory device of claim 1, further comprising:
   a cell array having a matrix form of split wordline pairs crossing bitlines;
   a wordline driver coupled to the wordlines;
   a decoder coupled to the bitlines; and
   an output unit coupled to the bitlines, wherein the wordline pairs are each the first and second metal line.

5. A memory device, comprising:
   a semiconductor substrate having a first active region and a second active region;
   a first gate electrode on the first active region of the substrate, and a second gate electrode on the second active region of the substrate;
   a first insulating layer having contact holes to expose the substrate on a first side of the gate electrodes;
   first electrodes of ferroelectric capacitors each formed along a bottom surface and side surfaces of each of the contact holes;
   ferroelectric layers on the first electrodes;
   a first split wordline that is a second electrode of the second ferroelectric capacitor coupled to the first gate electrode;
   a second split wordline that is a second electrode of the first ferroelectric capacitor coupled to the second gate electrode;
   a first bitline coupled to the substrate on a second side of the first gate electrode; and,
   a second bitline coupled to the substrate on a second side of the second gate electrode.

6. The memory device of claim 5, further comprising a barrier metal layer under the first electrodes of the ferroelectric capacitors.

7. The memory device of claim 6, wherein the barrier metal layer is a material selected from TiN, $RuO_2$, $IrO_2$, and $PtSi_2$.

8. The memory device of claim 5, wherein the first electrodes of the second ferroelectric capacitors are one of Pt, Ir, and Ru.

9. The memory device of claim 5, wherein the first electrodes of the ferroelectric capacitors fill the contact holes.

10. The memory device of claim 5, wherein ferroelectric layers are on the first insulating layer around the contact holes inclusive of upper portions of the first electrodes of the ferroelectric capacitors.

11. The memory device of claim 5, wherein the ferroelectric layers of the ferroelectric capacitors are in the contact holes.

12. The memory device of claim 11, further comprising a barrier metal layer under the first electrodes of the ferroelectric capacitors.

13. The memory device of claim 5, further comprising:

a cell array having a matrix form of split wordline pairs crossing a plurality of bitlines;

a wordline driver coupled to the split wordline pairs;

a decoder coupled to the plurality of bitlines; and an output unit coupled to the bitlines, wherein the split wordline pairs are each a plurality of second electrodes for ferroelectric capacitors, and wherein the plurality of bitlines includes the first and second bitlines and the split wordline pairs include the first and second split wordlines.

14. A memory device, comprising:

a semiconductor substrate having a plurality of pairs of a first active region and a second active region extending in a first direction asymmetric to, and spaced from each other;

a first gate electrode on each of the first active regions of the substrate, and a second gate electrode on each of the second active regions of the substrate;

a first insulating layer having first contact holes to expose the substrate on a first side of the first gate electrodes and second contact holes to expose the substrate on a first side of the second gate electrodes;

first and second ferroelectric capacitors respectively stacked on a bottom surface and side surfaces of each of the first and second contact holes;

a first split wordline on the second ferroelectric capacitors coupled to the first gate electrodes;

a second split wordline on the first ferroelectric capacitors coupled to the second gate electrodes;

a first bitline coupled to the substrate on a second side opposite the first side of the first gate electrodes; and a second bitline coupled to the substrate on a second side of the second gate electrodes.

15. The memory device of claim 14, further comprising a barrier metal layer under first electrodes of the ferroelectric capacitors.

16. The memory device of claim 15, wherein the barrier metal layer is one of TiN, $RuO_2$, $IrO_2$ and $PtSi_2$.

17. The memory device of claim 14, wherein the split wordlines are on second electrodes of the ferroelectric capacitors, and wherein the split wordlines and the second electrodes are separate conductive layers of different materials.

18. The memory device of claim 14, wherein the split wordlines are on second electrodes of the ferroelectric capacitors, and wherein the split wordlines and the second electrodes are separate conductive layers of the same material.

19. The memory device of claim 14, wherein the first electrodes of the second ferroelectric capacitors are one of Pt, Ir, and Ru.

20. The memory device of claim 14, wherein first electrodes of the ferroelectric capacitors fill the contact holes.

21. The memory device of claim 20, wherein ferroelectric layers and the second electrodes of the ferroelectric capacitors are formed on the first electrodes of the ferroelectric capacitors.

22. The memory device of claim 14, wherein the split wordlines and second electrodes of the ferroelectric capacitors are a single conductive layer.

23. The memory device of claim 22, wherein a barrier layer is under first electrodes of the ferroelectric capacitors.

* * * * *